United States Patent
Baba et al.

(10) Patent No.: US 11,605,869 B2
(45) Date of Patent: Mar. 14, 2023

(54) ELECTRONIC APPARATUS AND ELECTRICAL ELEMENT

(71) Applicant: Murata Manufacturing Co., Ltd., Nagaokakyo (JP)

(72) Inventors: Takahiro Baba, Nagaokakyo (JP); Akihiro Kikuchi, Nagaokakyo (JP); Genro Kato, Nagaokakyo (JP); Kosuke Nishino, Nagaokakyo (JP); Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 194 days.

(21) Appl. No.: 17/158,072

(22) Filed: Jan. 26, 2021

(65) Prior Publication Data

US 2021/0151845 A1 May 20, 2021

Related U.S. Application Data

(63) Continuation of application No. 16/833,711, filed on Mar. 30, 2020, now Pat. No. 10,944,145, which is a
(Continued)

(30) Foreign Application Priority Data

Dec. 1, 2014 (JP) .................................. 2014-243252
Feb. 20, 2015 (JP) .................................. 2015-031583
(Continued)

(51) Int. Cl.
*H01P 3/08* (2006.01)
*H05K 1/02* (2006.01)
(Continued)

(52) U.S. Cl.
CPC ................ *H01P 3/085* (2013.01); *H01P 3/08* (2013.01); *H05K 1/0239* (2013.01);
(Continued)

(58) Field of Classification Search
CPC . H01P 3/08; H01P 3/085; H01P 3/026; H05K 1/0239; H05K 1/0242;
(Continued)

(56) References Cited

U.S. PATENT DOCUMENTS 7,755,457 B2 * 7/2010 Lee .......................... H01P 3/085
333/204
2017/0033426 A1 2/2017 Baba et al.

FOREIGN PATENT DOCUMENTS

CN 102137541 A * 7/2011 ............. H05K 1/115
CN 111447736 A 7/2020
(Continued)

OTHER PUBLICATIONS

Baba et al., "Electronic Apparatus and Electrical Element", U.S. Appl. No. 16/833,711, filed Mar. 30, 2020.

*Primary Examiner* — Hafizur Rahman
(74) *Attorney, Agent, or Firm* — Keating & Bennett, LLP

(57) ABSTRACT

An electronic apparatus includes a substrate and an electrical element mounted on the substrate. The electrical element includes a base material including a first principal surface and a second principal surface that are deformable and flat or substantially flat surfaces and a conductor pattern included on the base material. The electrical element further includes a first connection portion and a second connection portion that connect to a circuit included on the substrate and a transmission line portion located in a position different from positions of the first connection portion and the second connection portion that electrically connects the first connection portion and the second connection portion. The
(Continued)

conductor pattern includes a conductor pattern of the first connection portion, a conductor pattern of the second connection portion, a conductor pattern of the transmission line portion, and an electrical-element-side bonding pattern arranged in the transmission line portion.

10 Claims, 30 Drawing Sheets

Related U.S. Application Data continuation of application No. 16/513,814, filed on Jul. 17, 2019, now Pat. No. 10,644,370, which is a continuation of application No. 15/407,328, filed on Jan. 17, 2017, now Pat. No. 10,424,824, which is a continuation of application No. PCT/JP2015/082825, filed on Nov. 24, 2015.

(30) Foreign Application Priority Data

| | | |
|---|---|---|
| Apr. 14, 2015 | (JP) | 2015-082161 |
| Jul. 3, 2015 | (JP) | 2015-134048 |
| Sep. 18, 2015 | (JP) | 2015-184589 |

(51) Int. Cl.
*H05K 1/14* (2006.01)
*H05K 1/03* (2006.01)
*H05K 1/11* (2006.01)
*H01P 3/02* (2006.01)

(52) U.S. Cl.
CPC ......... *H05K 1/0242* (2013.01); *H05K 1/0245* (2013.01); *H05K 1/0298* (2013.01); *H05K 1/0313* (2013.01); *H05K 1/111* (2013.01); *H05K 1/141* (2013.01); *H05K 1/147* (2013.01); *H01P 3/026* (2013.01); *H05K 1/0243* (2013.01); *H05K 1/144* (2013.01); *H05K 2201/0141* (2013.01)

(58) Field of Classification Search
CPC .. H05K 1/0245; H05K 1/0298; H05K 1/0313; H05K 1/111; H05K 1/141; H05K 1/147; H05K 1/0243; H05K 1/144; H05K 2201/0141
USPC .......................................................... 333/238
See application file for complete search history.

(56) References Cited

FOREIGN PATENT DOCUMENTS

| | | | |
|---|---|---|---|
| CN | 111447737 A | 7/2020 | |
| WO | WO-2013051599 A1 * | 4/2013 | ............ H01L 22/32 |

* cited by examiner

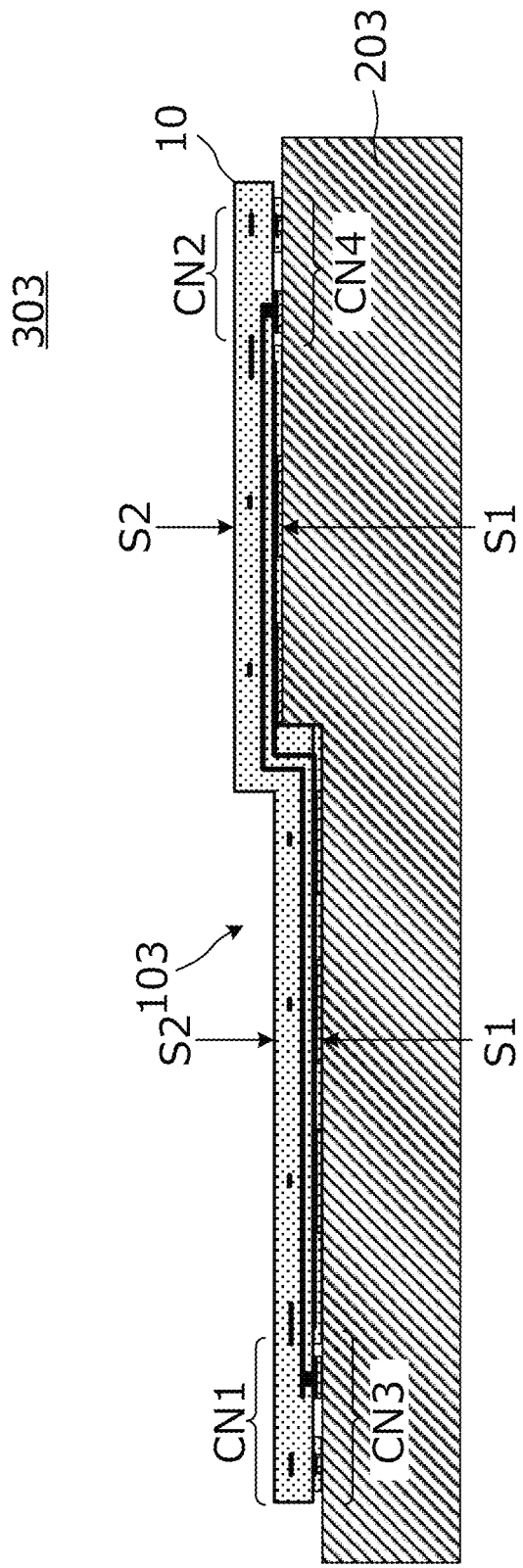

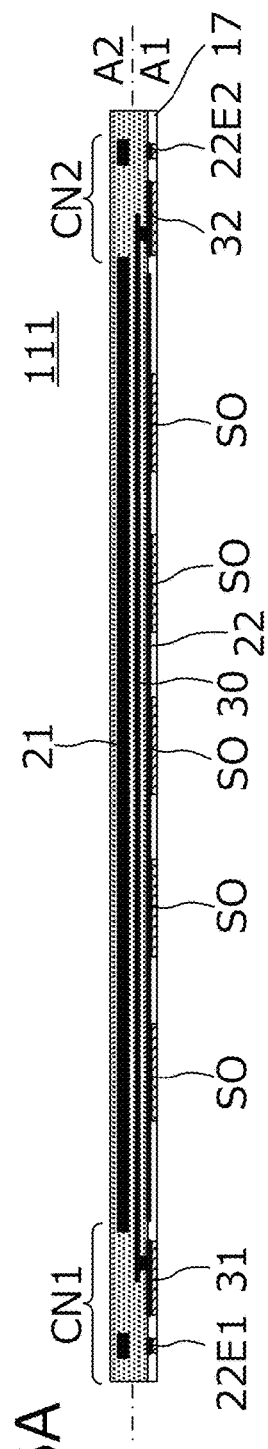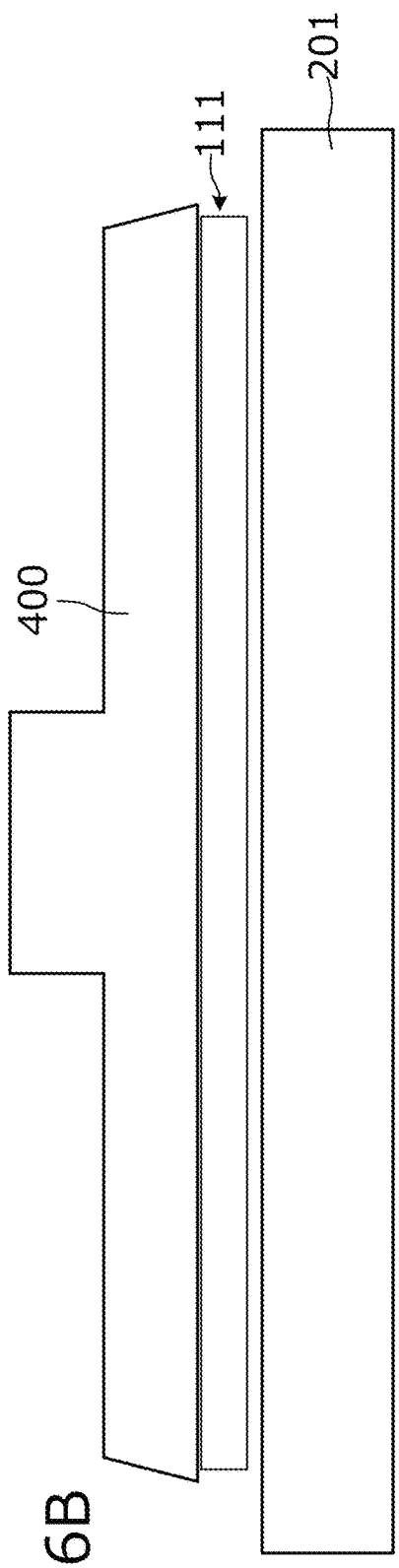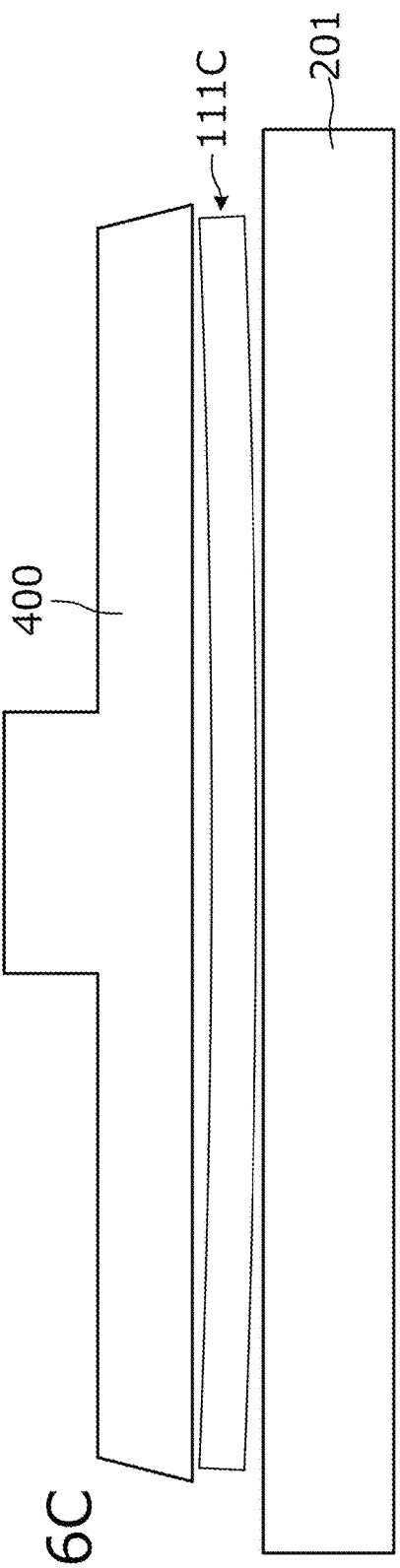

ELECTRONIC APPARATUS AND ELECTRICAL ELEMENT

CROSS REFERENCE TO RELATED APPLICATIONS

This application claims the benefit of priority to Japanese Patent Application 2014-243252 filed on Dec. 1, 2014, Japanese Patent Application 2015-031583 filed on Feb. 20, 2015, Japanese Patent Application 2015-082161 filed on Apr. 14, 2015, Japanese Patent Application 2015-134048 filed on Jul. 3, 2015, and Japanese Patent Application 2015-184589 filed on Sep. 18, 2015, and is a Continuation Application of PCT/JP2015/082825 filed on Nov. 24, 2015. The entire contents of each application are hereby incorporated herein by reference.

BACKGROUND OF THE INVENTION

1. Field of the Invention

The present invention relates to a flat, deformable electrical element mounted on a substrate, an electronic apparatus provided with such an electrical element, and an electrical element tray.

2. Description of the Related Art

As a high-frequency transmission line for connecting a high-frequency circuit and a high-frequency element, except for a transmission line formed on a circuit board, a coaxial cable is generally used. In recent years, with the high functionality and miniaturization of a high-frequency electronic apparatus, such as a mobile communication terminal, it is not possible to provide a space for storing a coaxial cable inside a terminal housing in some cases. Accordingly, a flat cable provided with a stripline type transmission line formed by stacking thin base sheets one over another, may be used. Since such a flat cable has a structure in which a signal line conductor is held between two ground conductors and is thin plate shaped, the dimension of the flat cable is able to be made smaller in the thickness direction than the dimension of the coaxial cable while the dimension of the flat cable is slightly larger in the width direction than the dimension of the coaxial cable. Therefore, the flat cable is useful in a case in which there is only a small clearance in the terminal housing.

However, since a coaxial connector provided in both ends of the flat cable requires a complicated manufacturing process such as a process of bending a thin metal plate and molding the thin metal plate with resin, for example, a small highly-accurate flat cable is difficult to be manufactured and is expensive. In addition, a mounting process for mounting the connector on the flat cable needs to be performed, and the higher positional accuracy is required and the manufacturing of the flat cable becomes more difficult as the size of the connector becomes smaller.

Accordingly, as disclosed in International Publication No. 2014/002757, for example, a detachable flat cable with a structure in which a connector is not used may be used.

FIG. 30 is a perspective view showing a mounting structure to mount on a substrate 70 a flat cable 40 disclosed in International Publication No. 2014/002757. The flat cable 40 is a cable configured such that an insulator 54 includes a stripline type transmission line including the structure in which a signal line conductor is held between two ground conductors. The substrate 70 includes a guide member 80.

The guide member 80 is provided with a connection portion of the flat cable 40. A signal terminal and a ground terminal are formed on the lower surface of the end portion of the flat cable 40. The end portion of the flat cable 40 includes a through hole that passes through the signal terminal and the ground terminal, and a conductive bonding material PS1 is printed inside.

The flat cable 40 as shown in FIG. 30 is mounted on the substrate 70 in the following processes.

To begin with, a guide member 80 is surface-mounted on the substrate 70.

The flat cable 40 is attached to the guide member 80.

The conductive bonding material PS1 is fused by a heating tool pressed against a formation position of the conductive bonding material PS1, which causes the signal terminal and the ground terminal of the flat cable 40 to be electrically connected to the guide member 80.

The processes described above with respect to FIG. 30 require a high overall number of processes, and, similar to a case of a conventional flat cable with a connector, also require a process only for connecting a flat cable.

SUMMARY OF THE INVENTION

Preferred embodiments of the present invention provide an electronic apparatus including an electrical element defining a flat cable, for example, an electrical element that is able to be mounted on a substrate by a simple process.

An electronic apparatus according to a preferred embodiment of the present invention includes a substrate and an electrical element mounted on the substrate; the electrical element includes a base material including a first principal surface and a second principal surface that are deformable and flat or substantially flat surfaces and a conductor pattern in contact with the base material; the electrical element further includes a first connection portion and a second connection portion that connect to a circuit included on the substrate, and a transmission line portion located in a position different from positions of the first connection portion and the second connection portion and electrically connecting the first connection portion and the second connection portion; the conductor pattern includes the first connection portion; the second connection portion, a conductor pattern of the transmission line portion, and an electrical-element-side bonding pattern in the transmission line portion; the transmission line portion is located in an area in an electrical path that connects the first connection portion and the second connection portion; the first connection portion, the second connection portion, and the electrical-element-side bonding pattern are exposed on the first principal surface of the base material; the substrate includes a third connection portion, a fourth connection portion, and a substrate-side bonding pattern; the first connection portion and the third connection portion are connected to each other; the second connection portion and the fourth connection portion are connected to each other; and the electrical-element-side bonding pattern and the substrate-side bonding pattern are bonded to each other.

With the features described above, the electrical element is able to be collectively surface-mounted on the substrate like other surface mounting components, so that the number of processes for mounting is able to be significantly reduced. In addition, since it is not necessary to provide a connector or a guide member, the number of components is also able to be reduced.

Preferably, a base material of the transmission line portion is smaller in width than a base material of the first connection portion and of the second connection portion. Accordingly, it is easy to electrically connect the electrical element and the substrate, arrange the transmission line portion within a limited range, and effectively utilize the space around the transmission line portion.

Preferably, the electrical-element-side bonding pattern includes a plurality of electrical-element-side bonding patterns; and the substrate-side bonding pattern includes a plurality of substrate-side bonding patterns. Accordingly, the electrical element is able to be accurately mounted with respect to the substrate, while the shape of the electrical element is kept constant, even if a distance between the first connection portion and the second connection portion is long.

Preferably, the plurality of electrical-element-side bonding patterns and the plurality of substrate-side bonding patterns are provided at equal or substantially equal intervals. Accordingly, abnormal movement of the electrical element with respect to the substrate at a time of batch bonding is significantly reduced or prevented by a reflow soldering process, even if the distance between the first connection portion and the second connection portion is long.

Preferably, the transmission line portion includes a ground conductor pattern and a signal conductor pattern, the transmission line portion includes a strip line structure or a microstrip line structure provided by the ground conductor pattern and the signal conductor pattern, and the electrical-element-side bonding pattern is a conductor pattern electrically connected to the ground conductor pattern or the ground conductor pattern. According to the features described above, the electrical element may be thin, since it is not necessary to provide a conductor pattern specifically dedicated to the electrical-element-side bonding pattern. In addition, if the substrate-side bonding pattern to which the electrical-element-side bonding pattern is bonded is a ground conductor pattern, the ground potential of the transmission line is able to be stabilized.

Preferably, the electrical-element-side bonding pattern is provided adjacent to or in a vicinity of at least one of the first connection portion and the second connection portion of the transmission line portion. Accordingly, the occurrence of positional misalignment between the first connection portion and the second connection portion and the substrate is significantly reduced, minimized, or prevented, and the substrate, by a self-alignment feature of the electrical-element-side bonding patterns. Therefore, the connection between the lower ground conductor pattern and the signal conductor pattern of the first connection portion, and the ground conductor pattern and the signal conductor pattern of the third connection portion that are included on the substrate is stabilized. Similarly, the connection between the lower ground conductor pattern and the signal conductor pattern of the second connection portion, and the ground conductor pattern and the signal conductor pattern of the fourth connection portion that are included on the substrate is stabilized.

Preferably, the electronic apparatus further includes a double-sided adhesive tape, and the double-sided adhesive tape is arranged in a portion in which no electrical-element-side bonding pattern of the transmission line portion is provided. Accordingly, a positional shift of the transmission line portion is significantly reduced or prevented, and the shape of the electrical element is able to be kept constant since the transmission line portion is able to be bonded to the substrate by the double-sided adhesive tape even if there is no space to provide a substrate-side bonding pattern on the substrate.

Preferably, the electrical element further includes a chip component including at least a first terminal and a second terminal, the first terminal is connected to the conductor pattern, the second terminal is exposed in a position different from the positions of the first connection portion and the second connection portion, the substrate further includes a fifth connection portion, and the second terminal of the chip component is connected to the fifth connection portion. Accordingly, a chip component is able to be provided and connected between the conductor pattern included on the base material and the connection portion on the substrate. Thus, the electrical element may have a small size without reducing functionality.

Preferably, the substrate further includes a substrate-side ground conductor, the transmission line portion includes a plurality of signal conductor patterns including a first signal conductor pattern and a second signal conductor pattern, the first signal conductor pattern includes a first linear conductor parallel or substantially parallel to the first principal surface, a first connection end portion exposed on the first principal surface of the first connection portion and connected to the substrate, a second connection end portion exposed on the first principal surface of the second connection portion and connected to the substrate, and a first interlayer connection conductor connecting the first linear conductor and the first connection end portion and connecting the first linear conductor and the second connection end portion; the second signal conductor pattern includes: a second linear conductor parallel or substantially parallel to the first principal surface, a first connection end portion exposed on the first principal surface of the first connection portion and connected to the substrate, a second connection end portion exposed on the first principal surface of the second connection portion and connected to the substrate, and a second interlayer connection conductor connecting the second linear conductor and the first connection end portion and connecting the second linear conductor and the second connection end portion; the second linear conductor is arranged, in a thickness direction of the base material, on a side closer to the second principal surface than to the first linear conductor; and at least one of the first connection end portion and the second connection end portion of the second signal conductor pattern includes at least a portion that overlaps the substrate-side ground conductor in a plan view and generates a capacitance.

With the features described above, since at least a portion of the second connection end portion and the substrate-side ground conductor face each other, a capacitance is generated in a portion in which the second connection end portion of the second signal conductor pattern and the substrate-side ground conductor face each other. Therefore, it is possible to determine and adjust regulated characteristic impedance to be provided up to the end portion of the second signal conductor pattern by providing a capacitance between the second connection end portion of the second signal conductor pattern, and the substrate-side ground conductor.

Preferably, the substrate further includes a first area including a portion that connects to at least one of the first connection end portion and the second connection end portion of the first signal conductor pattern, and a second area including a portion that connects to at least one of the first connection end portion and the second connection end portion of the second signal conductor pattern; a height of a mounting surface of the second area is higher than a height of a mounting surface of the first area; and the electrical element is arranged in such a manner that the first principal surface extends along the first area and the second area. According to the features described above, the difference in line length between the first signal conductor pattern and the second signal conductor pattern becomes small. Therefore, the inductance component of the second signal conductor pattern and the inductance component of the first signal conductor pattern are equal or substantially equal to each other, which reduces a gap in the characteristic impedance generated between the first signal conductor pattern and the second signal conductor pattern.

An electrical element according to a preferred embodiment of the present invention includes a base material including a first principal surface and a second principal surface that are deformable and flat or substantially flat surfaces, a conductor pattern in contact with the base material; the electrical element further includes a first connection portion, a second connection portion, a transmission line portion located in a position different from positions of the first connection portion and the second connection portion that electrically connects the first connection portion and the second connection portion; the conductor pattern includes the first connection portion, the second connection portion, a conductor pattern of the transmission line portion, and a bonding pattern in the transmission line portion; the transmission line portion is located in an area in an electrical path that connects the first connection portion and the second connection portion; and the first connection portion, the second connection portion, and the bonding pattern are exposed on the first principal surface of the base material.

With the features described above, the electrical element is able to be collectively surface-mounted on the substrate with other surface mounting components, so that the total number of processes performed for mounting is able to be significantly reduced. In addition, since it is not necessary to provide a connector, the number of components is also able to be reduced. Furthermore, the height or thickness of a connector is able to be reduced.

Preferably, the transmission line portion includes a ground conductor pattern and a signal conductor pattern; the transmission line portion includes a strip line structure or a microstrip line structure provided by the ground conductor pattern and the signal conductor pattern; and the bonding pattern is a conductor pattern electrically connected to the ground conductor pattern or the ground conductor pattern. According to the features described above, the electrical element may be thin, since it is not necessary to provide a conductor pattern specifically dedicated to the electrical-element-side bonding pattern. In addition, if the bonding pattern is connected to the ground conductor on the substrate, the ground potential of the transmission line is able to be stabilized.

Preferably, the transmission line portion further includes a plurality of signal conductor patterns including a first signal conductor pattern and a second signal conductor pattern, and a capacitance-generating flat conductor; the first signal conductor pattern includes a first linear conductor parallel or substantially parallel to the first principal surface; the second signal conductor pattern includes a second linear conductor parallel or substantially parallel to the first principal surface, a first connection end portion exposed on the first principal surface of the first connection portion, a second connection end portion exposed on the first principal surface of the second connection portion, and a second interlayer connection conductor connecting the second linear conductor and the first connection end portion and connecting the second linear conductor and the second connection end portion; the second linear conductor is arranged, in a thickness direction of the base material, on a side closer to the second principal surface than to the first linear conductor; and the capacitance-generating flat conductor is at least one of a conductor pattern as a portion of the second linear conductor, a conductor pattern connected to the second interlayer connection conductor, the first connection end portion, and the second connection end portion, and, when viewed in the thickness direction of the base material, at least partially overlaps the ground conductor pattern.

With the features described above, since at least a portion of the capacitance-generating flat conductor and the ground conductor pattern face each other, a capacitance is respectively provided in a portion in which the capacitance-generating flat conductor and the ground conductor pattern face each other. Therefore, it is possible to determine and adjust regulated characteristic impedance to be provided up to the end portion of the second signal conductor pattern by providing the capacitance-generating flat conductor that overlaps the ground conductor pattern in the second signal conductor pattern of which the path length is longer than the path length of the first signal conductor pattern.

Preferably, the transmission line portion further includes a plurality of signal conductor patterns including a first signal conductor pattern and a second signal conductor pattern; and a length from a first end portion of the first signal conductor pattern in the first connection portion to a second end portion of the first signal conductor pattern in the second connection portion is different from a length from a first end portion of the second signal conductor pattern in the first connection portion to a second end portion of the second signal conductor pattern in the second connection portion. Accordingly, a transmission loss is significantly reduced or prevented when signals of which the frequencies are different from each other are transmitted in the first transmission line including the first signal conductor pattern and the second transmission line including the second signal conductor pattern.

Preferably, a first ground conductor pattern is arranged between the first end portion of the first signal conductor pattern in the first connection portion and the first end portion of the second signal conductor pattern in the first connection portion, and a second ground conductor pattern is arranged between the second end portion of the first signal conductor pattern in the second connection portion and the second end portion of the second signal conductor pattern in the second connection portion. Accordingly, cross talk between the first transmission line including the first signal conductor pattern and the second transmission line including the second signal conductor pattern is able to be significantly reduced or prevented.

Preferably, the transmission line portion is smaller in width than the first connection portion and the second connection portion. Accordingly, it is easy to electrically connect the electrical element and the substrate, arrange the transmission line portion in a limited range, and effectively utilize the space around the transmission line portion.

Preferably, the bonding pattern includes a plurality of bonding patterns. Accordingly, the electrical element is able to be accurately mounted with respect to the substrate, while the shape of the electrical element is kept constant, even if a distance between the first connection portion and the second connection portion is long.

Preferably, the plurality of bonding patterns are provided at equal or substantially equal intervals. Accordingly, abnormal movement of the electrical element with respect to the substrate at a time of batch bonding is significantly reduced or prevented by a reflow soldering process, even if the distance between the first connection portion and the second connection portion is long.

Preferably, the first connection portion and the second connection portion are offset in a direction perpendicular or substantially perpendicular to a central axis of an extending direction of the transmission line portion, with respect to the transmission line portion, and a direction in which the first connection portion and the second connection portion are offset is opposite to a direction with reference to the central axis. Accordingly, the flexibility of arrangement of a peripheral member is able to be increased, since a large empty space between the both sides of the transmission line portion is able to be provided.

Preferably, the bonding pattern is provided adjacent to or in a vicinity of at least one of the first connection portion of the transmission line portion and the second connection portion of the transmission line portion. Accordingly, the occurrence of positional misalignment between the first connection portion and the second connection portion and the substrate is significantly reduced, minimized, or prevented, and the substrate, by a self-alignment feature of the electrical-element-side bonding patterns. Therefore, the connection between the lower ground conductor pattern, the first signal conductor pattern, and the second signal conductor pattern of the first connection portion, and the ground conductor pattern and the signal conductor pattern of the third connection portion that are included on the substrate is stabilized. Similarly, the connection between the lower ground conductor pattern, the first signal conductor pattern, and the second signal conductor pattern of the second connection portion, and the ground conductor pattern and the signal conductor pattern of the fourth connection portion that are included on the substrate is stabilized.

Preferably, the electrical element further includes a double-sided adhesive tape, and the double-sided adhesive tape is arranged in a portion in which no bonding pattern of the transmission line portion is provided. Accordingly, a positional shift of the transmission line portion is significantly reduced or prevented, and the shape of the electrical element is able to be kept constant since the transmission line portion is able to be bonded to the substrate by the double-sided adhesive tape even if there is no space to provide a substrate-side bonding pattern on the substrate.

Preferably, the electrical element further includes a chip component including at least a first terminal and a second terminal, the first terminal is connected to the conductor pattern, and the second terminal is exposed in a position different from the positions of the first connection portion and the second connection portion. Accordingly, the chip component is able to be directly connected to the conductor pattern included on the base material during mounting of the electrical element to the substrate. Thus, the electrical element may have a small size without reducing functionality.

Preferably, the bonding pattern is arranged in a position that does not overlap, in a plan view, a suction port of an adsorption head that adsorbs the electrical element when the electrical element is carried. Accordingly, the adsorption head is less likely to adsorb solder printed on the substrate-side bonding pattern at the time of mounting the electrical element to the substrate. Therefore, clogging of the adsorption head due to suction of solder is significantly reduced or prevented.

Preferably, a conductor ratio on a side of the second principal surface of the base material is greater than or equal to a conductor ratio on a side of the first principal surface of the base material. Accordingly, it is easier to pick up and convey the electrical element, and it is also easier to bond the electrical element to a substrate-side bonding pattern, since a curvature that makes the second principal surface (that is, a surface opposite to the mounting surface) of the electrical element concave is significantly reduced or prevented and thus the flatness of the electrical element becomes high.

An electrical element tray according to a preferred embodiment of the present invention is a tray to store the electrical element when the electrical element, as described above, is carried and includes a groove in a position that faces the transmission line portion of the electrical element, the groove extending in a direction perpendicular or substantially perpendicular to the extending direction of the transmission line portion. According to the features described above, the tray does not interfere in the adsorption portion of the adsorption head that adsorbs the transmission line portion, so that the transmission line portion of the electrical element is able to be sucked appropriately.

According to various preferred embodiments of the present invention, electrical elements are able to be collectively surface-mounted on the substrate like other surface mounting components, so that the number of processes for mounting is able to be significantly reduced. In addition, since it is not necessary to provide a connector or a guide member, the number of components is able to be decreased and the height of the electrical element is able to be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a sectional view of a main portion of an electronic apparatus according to a third preferred embodiment of the present invention.

FIG. 26A is a sectional view of the electrical element according to the eleventh preferred embodiment of the present invention. FIG. 26B is a schematic sectional view showing the electrical element mounted on the substrate. FIG. 26C is a schematic sectional view showing an electrical element according to a reference example mounted on the substrate.

DETAILED DESCRIPTION OF THE PREFERRED EMBODIMENTS

Figure 1:
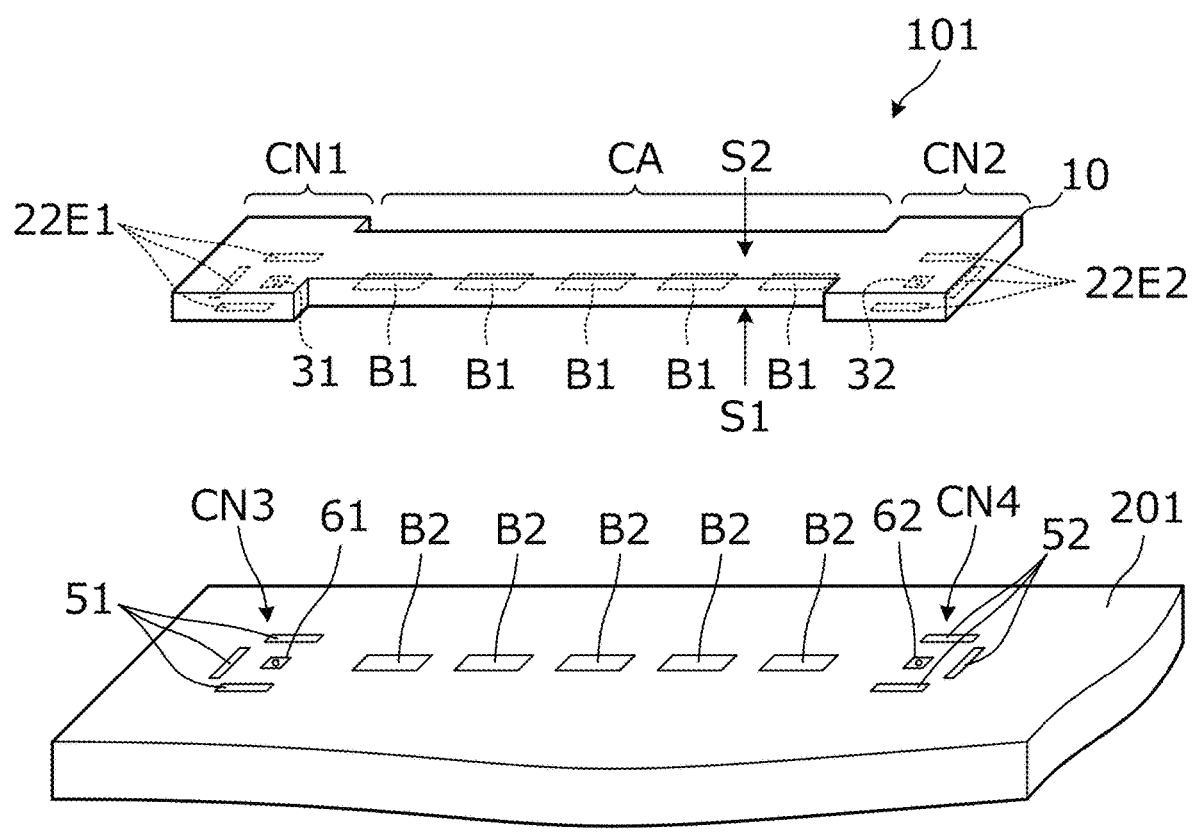
FIG. 1 is an exploded perspective view of a main portion of an electronic apparatus according to a first preferred embodiment of the present invention.

Hereinafter, a plurality of preferred embodiments of the present invention will be described with reference to the attached drawings and several specific examples. In the drawings, components and elements assigned with the same reference numerals or symbols represent identical components and elements. In preferred embodiments after the second preferred embodiment, a description of features common to the first preferred embodiment will be omitted, and different features are primarily described.

First Preferred Embodiment

Figure 2:
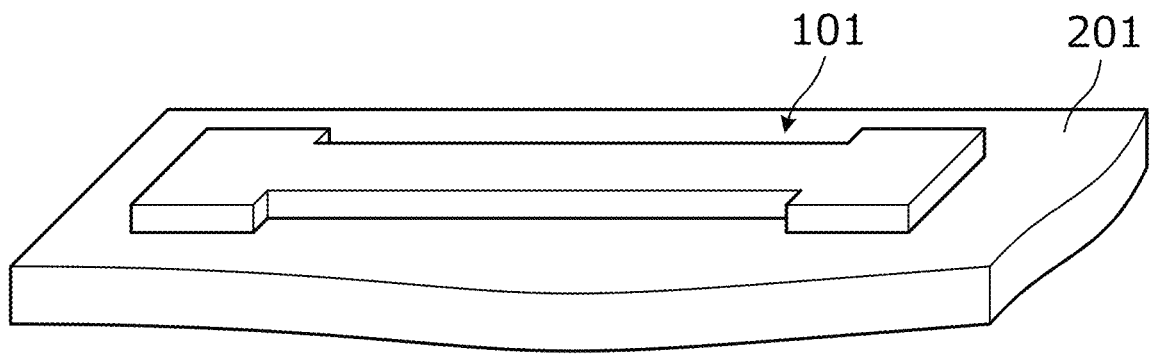
FIG. 2 is a perspective view of the main portion of the electronic apparatus according to the first preferred embodiment of the present invention.

FIG. 1 is an exploded perspective view of a main portion of an electronic apparatus according to a first preferred embodiment of the present invention, and FIG. 2 is a perspective view of the main portion of the electronic apparatus.

As shown in FIG. 2, the electronic apparatus 301 according to the first preferred embodiment is provided with a substrate 201 and an electrical element 101 mounted on the substrate 201. Although elements other than the electrical element 101 may be mounted on the substrate 201, the elements are not shown in FIG. 1 and FIG. 2 for clarity.

The electrical element 101 shown in FIG. 1 and FIG. 2 is provided with a base material 10 including a first principal surface S1 and a second principal surface S2 that are deformable and flat or substantially flat, and various conductor patterns in contact with the base material 10. The deformable base material 10 is a flexible base material that is elastically deformed or plastically deformed by an external force. The base material 10 is a laminate of liquid crystal polymer sheets, for example. The various conductor patterns are preferably formed by patterning copper foil attached on each of the liquid crystal polymer sheets.

The electrical element 101 includes a first connection portion CN1 and a second connection portion CN2 that connect to a circuit provided on the substrate 201; a transmission line portion CA connected to the first connection portion CN1 and the second connection portion CN2; and an electrical-element-side bonding pattern B1 arranged (exposed) in a position different from positions of the first connection portion CN1 and the second connection portion CN2.

The first connection portion CN1, the second connection portion CN2, and the electrical-element-side bonding pattern B1 are exposed on the first principal surface S1 of the base material 10.

The first connection portion CN1 is provided by a lower ground conductor pattern 22E1 and a signal conductor pattern 31. In addition, the second connection portion CN2 is provided by a lower ground conductor pattern 22E2 and a signal conductor pattern 32.

The substrate 201 is provided with a third connection portion CN3 to which the first connection portion CN1 of the electrical element 101 is connected, a fourth connection portion CN4 to which the second connection portion CN2 of the electrical element 101 is connected, and a substrate-side bonding pattern B2 to which the electrical-element-side bonding pattern B1 of the electrical element 101 is bonded.

The third connection portion CN3 is provided by a ground conductor pattern 51 and a signal conductor pattern 61. The fourth connection portion CN4 is provided by a ground conductor pattern 52 and a signal conductor pattern 62.

The lower ground conductor pattern 22E1 and the signal conductor pattern 31 of the first connection portion CN1 are respectively soldered to the ground conductor pattern 51 and the signal conductor pattern 61 of the third connection portion CN3. The lower ground conductor pattern 22E2 and the signal conductor pattern 32 of the second connection portion CN2 are respectively soldered to the ground conductor pattern and the signal conductor pattern 62 of the fourth connection portion CN4.

The transmission line portion CA of the electrical element 101 is smaller in width than the first connection portion CN1 and the second connection portion CN2, and the electrical-element-side bonding pattern B1 is provided in the transmission line portion CA. Accordingly, it is easy to electrically connect the electrical element 101 and the substrate 201, arrange the transmission line portion CA within a limited range, and effectively utilize the space around the transmission line portion CA.

The electrical-element-side bonding pattern B1 includes a plurality of electrical-element-side bonding patterns B1, and the substrate-side bonding pattern B2 includes a plurality of substrate-side bonding patterns B2. Accordingly, the electrical element 101 is able to be accurately mounted with respect to the substrate 201, while the shape of the electrical element 101 is kept constant or substantially constant, even if the width of the transmission line portion CA is small and a distance between the first connection portion CN1 and the second connection portion CN2 (and a distance between the third connection portion CN3 and the fourth connection portion CN4) is large. Thus, the electrical element 101 is able to be mounted with respect to the substrate 201 with high accuracy even if the electrical element 101 has a deformable shape.

Figure 3:
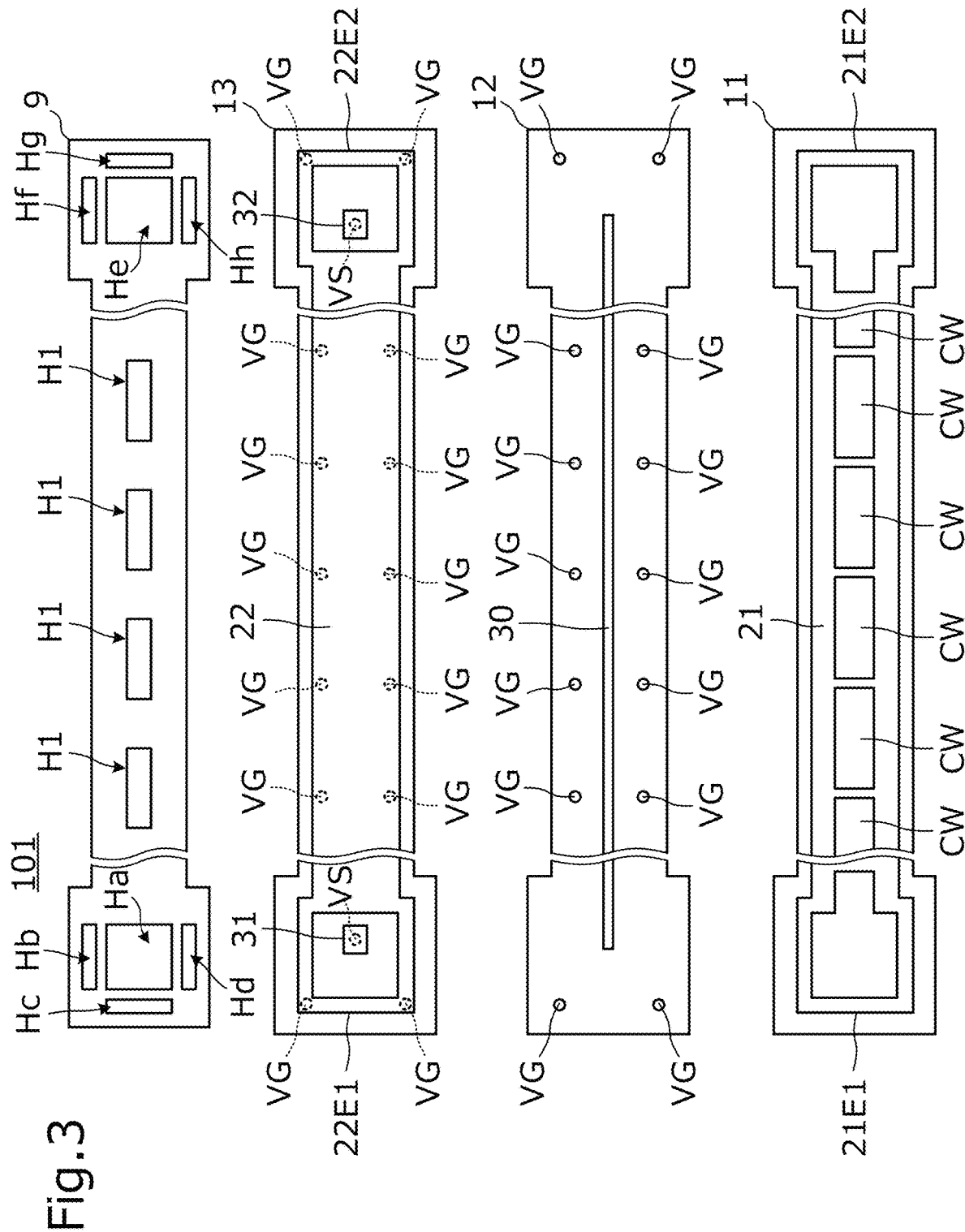
FIG. 3 is a plan view showing each insulator layer provided in an electrical element and various conductor patterns that are included on each insulator layer.
Figure 4:
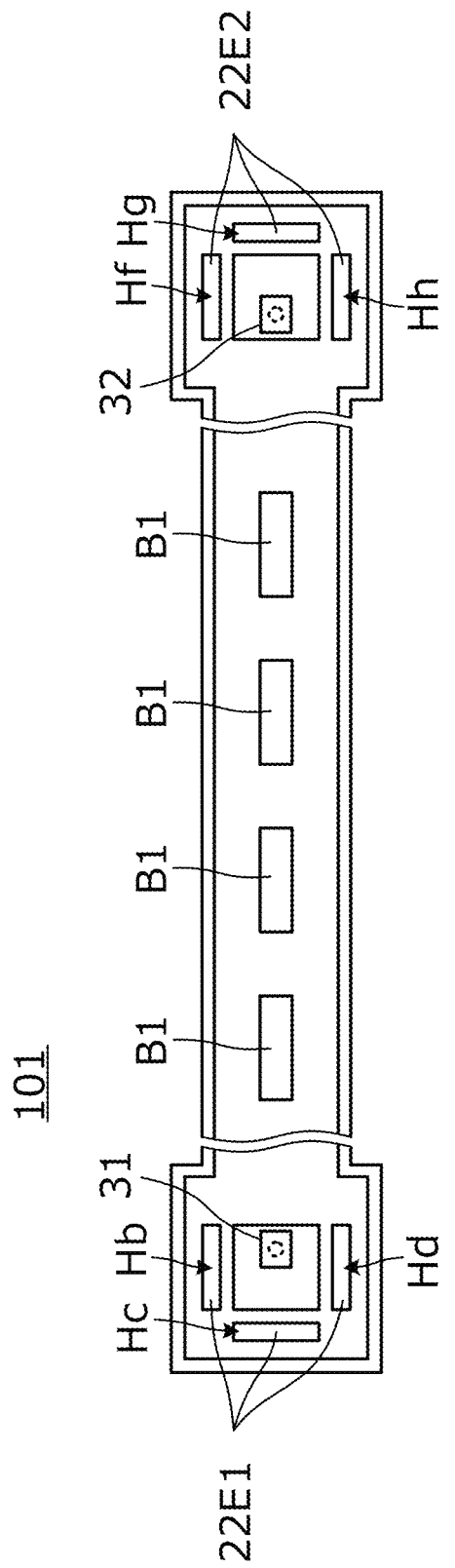
FIG. 4 is a plan view of a mounting surface of the electrical element shown in FIG. 3.

FIG. 3 is a plan view showing each insulator layer provided in an electrical element 101 and various conductor patterns that are provided on each insulator layer. FIG. 4 is a plan view of a mounting surface of the electrical element 101.

The insulator layers 11, 12, and 13 are respectively provided with an upper ground conductor pattern 21, a signal conductor pattern 30, and a lower ground conductor pattern 22. The upper ground conductor pattern 21 includes a plurality conductor openings CW. In other words, the upper ground conductor pattern 21 is provided in the shape of a ladder or a mesh pattern. The first end portion of the upper ground conductor pattern 21 is provided as an upper ground conductor pattern 21E1 of the first connection portion CN1. Similarly, the second end portion of the upper ground conductor pattern 21 is provided as an upper ground conductor pattern 21E2 of the second connection portion CN2. The first end portion of the lower ground conductor pattern 22 is provided as a lower ground conductor pattern 22E1 of the first connection portion CN1. Similarly, the second end portion of the lower ground conductor pattern 22 is provided as a lower ground conductor pattern 22E2 of the second connection portion CN1. The upper ground conductor patterns 21, 21E1, and 21E2 are respectively connected to the lower ground conductor patterns 22, 22E1, and 22E2 through a plurality of interlayer connection conductors VG.

The insulator layer 13 is provided with the signal conductor patterns 31 and 32 of the first connection portion CN1 and the second connection portion CN2. The signal conductor patterns 31 and 32 are respectively connected to the both ends of the signal conductor pattern 30 through an interlayer connection conductor VS.

A protective film 9 includes openings Ha, Hb, Hc, Hd, He, Hf, Hg, and Hh, and a plurality of openings H1. The openings Hb, Hc, and Hd partially expose the lower ground conductor pattern 22E1 provided on the insulator layer 13, and the opening Ha exposes the signal conductor pattern 31 provided on the insulator layer 13. Similarly, the openings Hf, Hg, and Hh partially expose the lower ground conductor pattern 22E2 provided on the insulator layer 13, and the opening He exposes the signal conductor pattern 32 provided on the insulator layer 13.

The plurality of openings H1 partially expose the lower ground conductor pattern 22 provided on the insulator layer 13. The exposed portions are the electrical-element-side bonding patterns B1. According to the features described above, the electrical element 101 may be thin, since it is not necessary to provide a conductor pattern specifically dedicated to the electrical-element-side bonding pattern.

Figure 5:
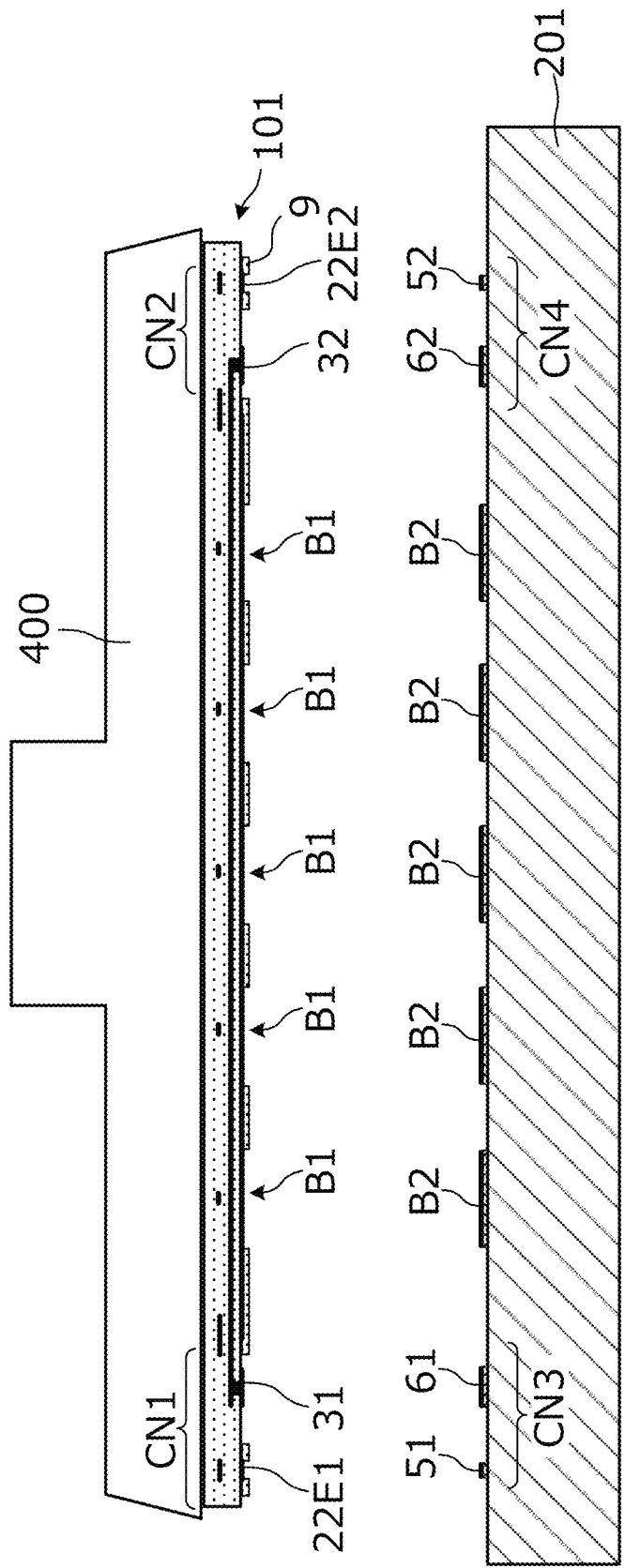
FIG. 5 is a sectional view showing the electrical element shown in FIG. 3 mounted on a substrate.
Figure 6:
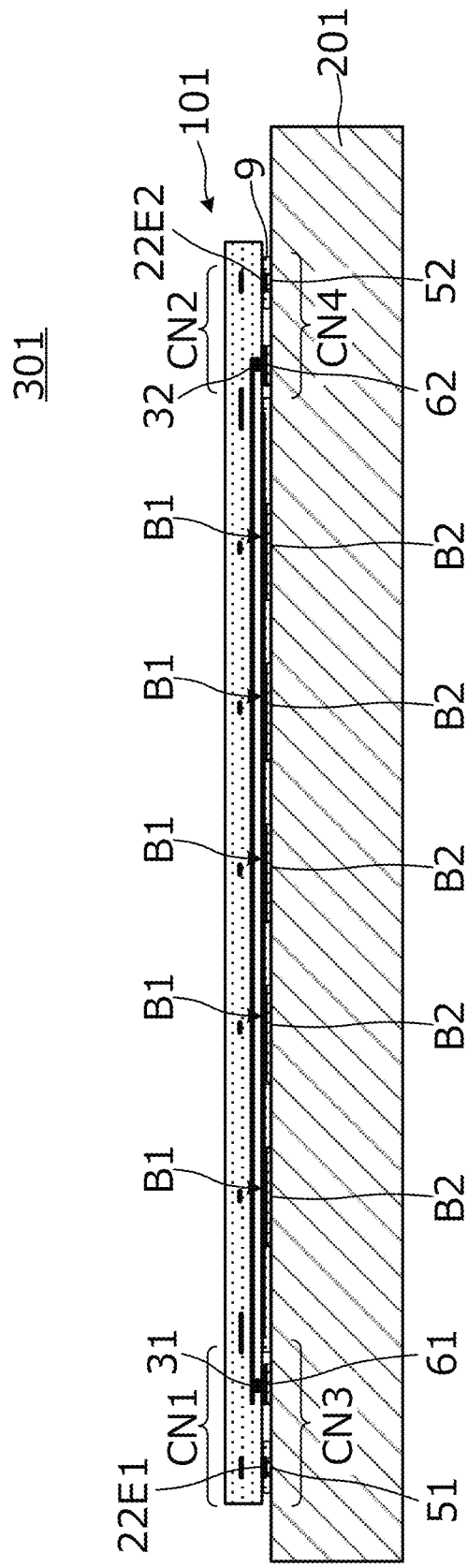
FIG. 6 is a sectional view showing the electrical element shown in FIG. 3 after the electrical element is mounted on the substrate shown in FIG. 5.

FIG. 5 is a sectional view showing the electrical element 101 mounted on a substrate 201. FIG. 6 is a sectional view showing the electrical element 101 after the electrical element 101 is mounted on the substrate 201.

Solder is applied to each of the surfaces of the ground conductor patterns 51 and 52, the signal conductor patterns 61 and 62, and the substrate-side bonding pattern B2 that are included on the substrate 201.

The electrical element 101 is an electrical element that has a flat or substantially flat shape and is able to deform easily. A tip tool 400 is attached to a vacuum adsorption chuck. The tip tool 400 includes an adsorption surface that covers the entirety or substantially the entirety of the second principal surface of the electrical element 101. A plurality of electrical elements 101 are previously stored in a pallet, for example. The vacuum adsorption chuck to which the tip tool 400 is attached takes up the electrical elements 101 from the pallet, and places the electrical elements 101 in a predetermined position of the substrate 201. The substrate 201 is then passed through a reflow furnace, so that the electrical element 101 and other elements provided on the substrate 201 are soldered on the substrate 201 by batch reflow soldering. In other words, the electrical element 101 is mounted as a surface mounting component as well as the other elements.

At a time of the soldering, the solder may be settled in the openings (depressed areas) provided in the protective film 9 by a self-alignment feature. Thus, the electrical element 101 is mounted with high precision on the substrate 201.

In addition, since the electrical-element-side bonding patterns B1 and the substrate-side bonding patterns B2 are provided at equal or substantially equal intervals, even if a distance between the first connection portion CN1 and the second connection portion CN2 (and between the third connection portion CN3 and the fourth connection portion CN4) is long, the electrical element is able to be prevented from abnormally moving with respect to the substrate during the batch reflow soldering.

By the soldering, the lower ground conductor pattern 22E1 and the signal conductor pattern 31 of the first connection portion CN1 are respectively connected to the ground conductor pattern 51 and the signal conductor pattern 61 of the third connection portion CN3 that are included on the substrate 201. Similarly, the lower ground conductor pattern 22E2 and the signal conductor pattern 32 of the second connection portion CN2 are respectively connected to the ground conductor pattern 52 and the signal conductor pattern 62 of the fourth connection portion CN4. In addition, the electrical-element-side bonding pattern B1 is bonded to the substrate-side bonding pattern B2.

The substrate-side bonding pattern B2 is a ground electrode, and the ground conductor pattern of the transmission line portion CA of the electrical element 101 is also electrically connected to the substrate-side bonding pattern B2. Thus, the ground potential of the transmission line of the electrical element 101 is stabilized.

Second Preferred Embodiment

A second preferred embodiment of the present invention provides an example of an electrical element in which two connection portions of end portions are not arranged on opposite ends of an elongated portion, and an example of an electrical element provided with three or more connection portions.

Figure 7:
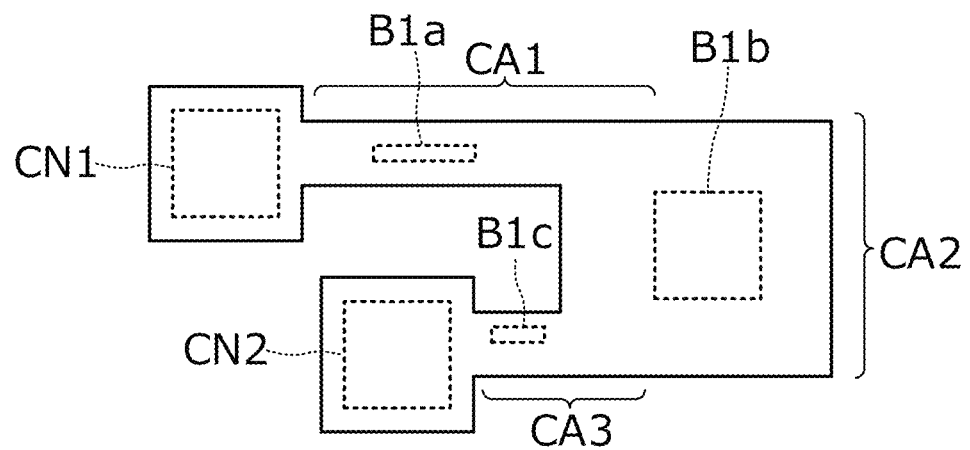
FIG. 7 is a plan view of an electrical element according to a second preferred embodiment of the present invention.

FIG. 7 is a plan view of an electrical element 102A according to the second preferred embodiment. The electrical element 102A is provided with a first connection portion CN1 and a second connection portion CN2 that connect to a circuit included (provided) on the substrate. In addition, the electrical element 102A is provided with transmission line portions CA1, CA2, and CA3 connected between the first connection portion CN1 and the second connection portion CN2. Furthermore, the electrical element 102A is provided with electrical-element-side bonding patterns B1a, B1b, and B1c arranged between the first connection portion CN1 and the second connection portion CN2.

Although a planar shape of the electrical element 102A is different from the shape of the electrical element 101 described in the first preferred embodiment, the basic configuration of electrical element 102A is the same or substantially the same as the configuration of the electrical element 101. Thus, according to the second preferred embodiment, the electrical element includes two connection portions that are not arranged on the opposite ends of an elongated portion.

Figure 8:
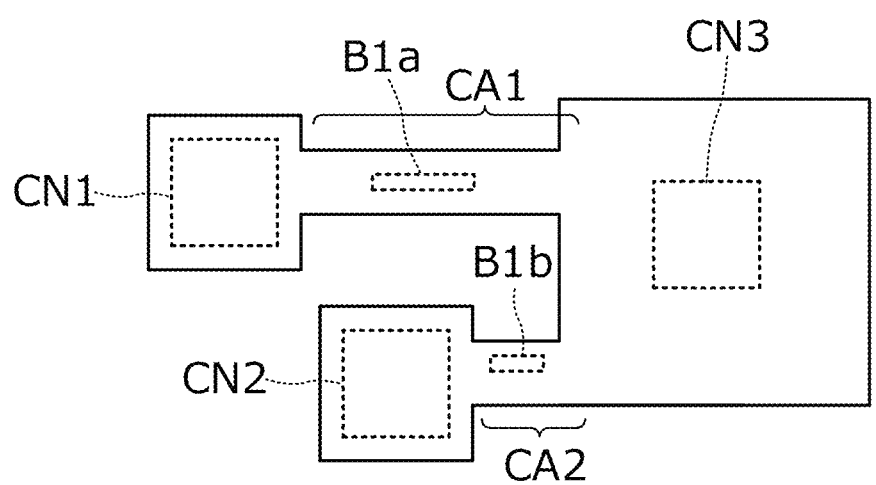
FIG. 8 is a plan view of another electrical element according to the second preferred embodiment of the present invention.

FIG. 8 is a plan view of another electrical element 102B according to the second preferred embodiment. The electrical element 102B is provided with a first connection portion CN1, a second connection portion CN2, and a third connection portion CN3 that connect to a circuit included (provided) on the substrate. In addition, the electrical element 102B is provided with a transmission line portion CA1 that connects to the first connection portion CN1 and the third connection portion CN3, and a transmission line portion CA2 that connects to the second connection portion CN2 and the third connection portion CN3. Furthermore, the electrical element 102B is provided with an electrical-element-side bonding pattern B1a arranged between the first connection portion CN1 and the third connection portion CN3, and an electrical-element-side bonding pattern B1b arranged between the second connection portion CN2 and the third connection portion CN3.

Although the electrical element 102B is different from the electrical element 101 described in the first preferred embodiment by including the three connection portions, the basic configuration of electrical element 102B is the same or substantially the same as the configuration of the electrical element 101. Thus, according to the second preferred embodiment, the electrical element is provided with three or more connection portions.

Third Preferred Embodiment

FIG. 9 is a sectional view of a main portion of an electronic apparatus 303 according to a third preferred embodiment of the present invention. The electronic apparatus 303 according to the third preferred embodiment is provided with a substrate 203, and an electrical element 103 mounted on the substrate 203. The electrical element 103 shown in FIG. 9 is provided with a base material 10 including a first principal surface S1 and a second principal surface S2 that are partially flat and deformable, and various conductor patterns in contact with the base material 10.

Although the basic configuration of the electrical element 103 is the same or substantially the same as the configuration of the electrical element 101 described in the first preferred embodiment, the electrical element 103 includes the transmission line portion that is formed into a crank shape before being mounted. The substrate 203 is provided with a level difference portion.

The electrical element 103 has plastic deformation characteristics, is easily formed in a metal mold, and maintains a predetermined shape by itself. Therefore, when picking up the electrical element 103, a tip tool of the vacuum adsorption chuck conformed to the shape of the electrical element 103 is used. Alternatively, the main flat portion of the electrical element 103 is adsorbed.

Fourth Preferred Embodiment

A fourth preferred embodiment of the present invention provides an example of an electrical element provided with a plurality of signal conductor patterns.

Figure 10A:
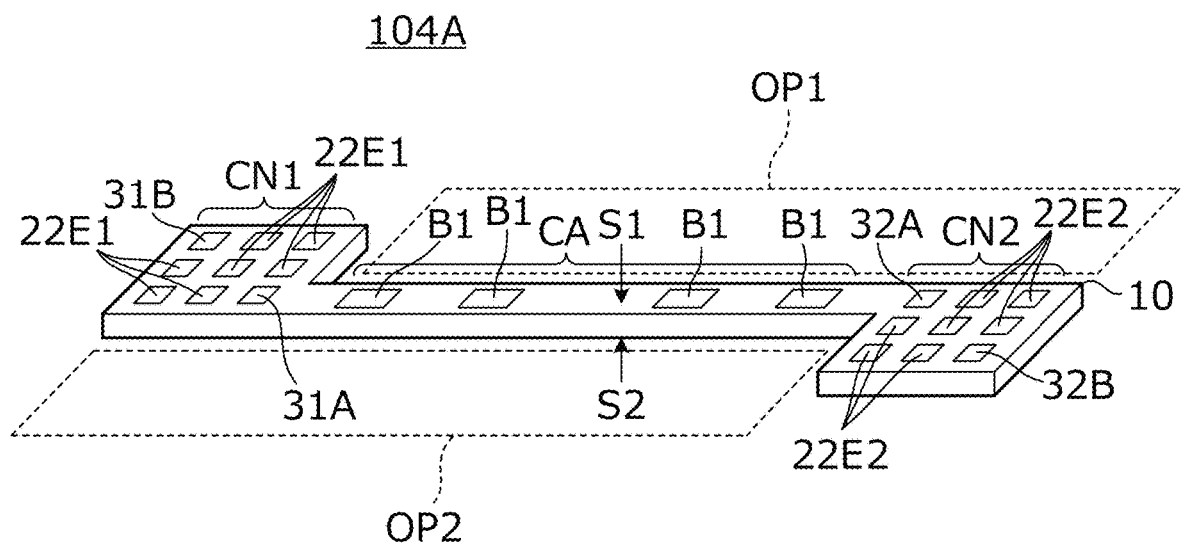
FIG. 10A is a perspective view of an electrical element according to a fourth preferred embodiment of the present invention.
Figure 10B:
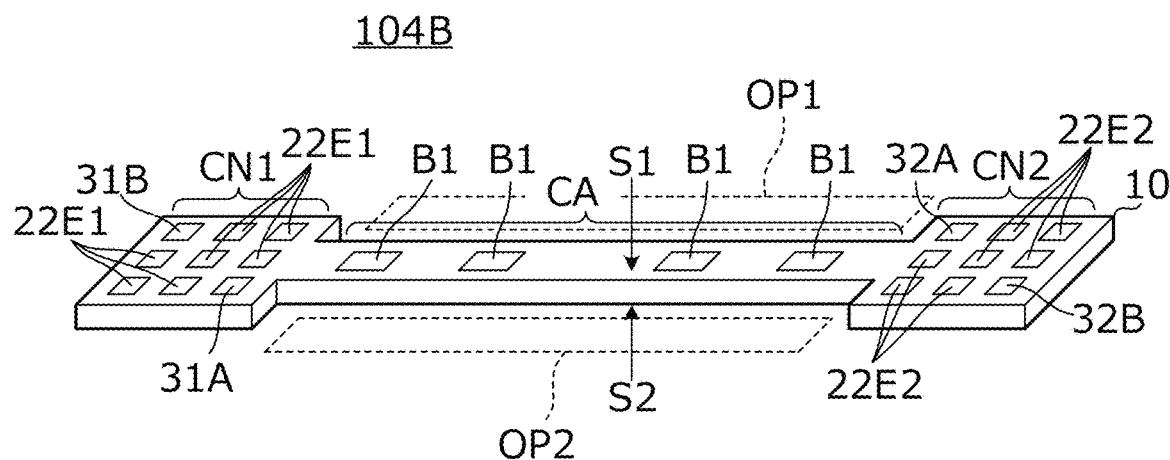
FIG. 10B is a perspective view of another electrical element according to the fourth preferred embodiment of the present invention.

FIG. 10A is a perspective view of an electrical element 104A according to the fourth preferred embodiment and FIG. 10B is a perspective view of another electrical element 104B according to the fourth preferred embodiment.

The electrical element 104A shown in FIG. 10A is provided with a base material 10 including a first principal surface S1 and a second principal surface S2, which are deformable and flat or substantially flat surfaces, and various conductor patterns in contact with the base material 10. The deformable base material 10 is a flexible base material that is elastically deformed or plastically deformed by an external force. The base material 10 is a laminate of liquid crystal polymer sheets, for example. The various conductor patterns are preferably formed by patterning copper foil attached on each of the liquid crystal polymer sheets.

The electrical element 104A includes a first connection portion CN1 and a second connection portion CN2 that connect to a circuit included on the substrate; a transmission line portion CA connected to the first connection portion CN1 and the second connection portion CN2; and a plurality of electrical-element-side bonding patterns B1 arranged (exposed) in positions different from positions of the first connection portion CN1 and the second connection portion CN2.

The first connection portion CN1, the second connection portion CN2, and the electrical-element-side bonding patterns B1 are exposed on the first principal surface S1 of the base material 10. That is, contrary to the viewpoint as shown in FIG. 1 in the first preferred embodiment, the mounting surface of the electrical element 104A of the fourth preferred embodiment is the upper surface.

The first connection portion CN1 is provided by a lower ground conductor pattern 22E1, a first signal conductor pattern 31A, and a second signal conductor pattern 31B. In addition, the second connection portion CN2 is provided by a lower ground conductor pattern 22E2, a first signal conductor pattern 32A, and a second signal conductor pattern 32B.

Figure 11:
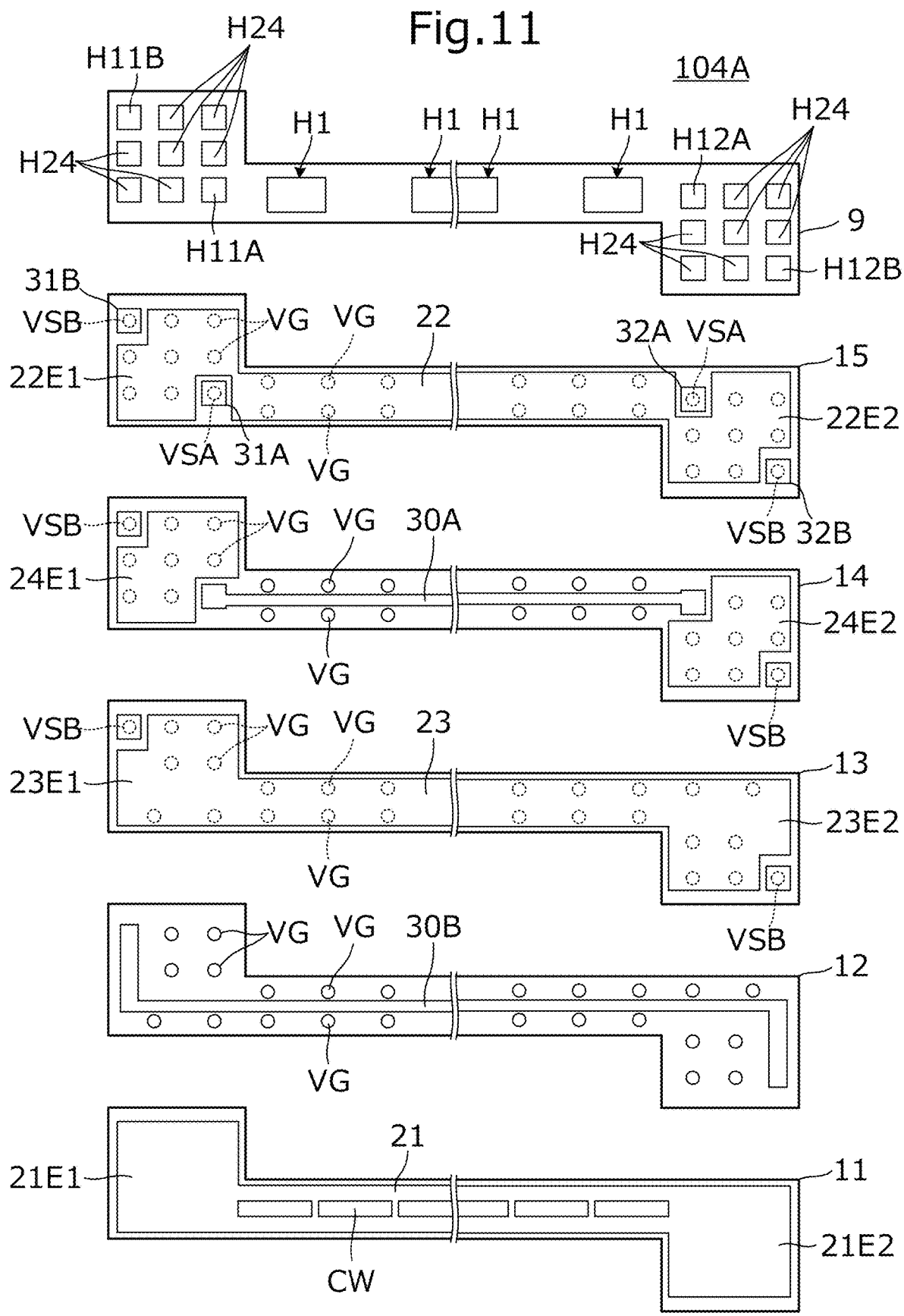
FIG. 11 is a plan view showing each insulator layer provided in the electrical element shown in FIG. 10A and various conductor patterns that are each included on the insulator layer.

FIG. 11 is a plan view showing each insulator layer provided in the electrical element 104A and various conductor patterns that are each provided on the insulator layer.

The insulator layer 11 is provided with an upper ground conductor pattern 21. The insulator layer 12 is provided with the second signal conductor pattern 30B and a plurality of interlayer connection conductors VG. The insulator layer 13 is provided with middle ground conductor patterns 23, 23E1, and 23E2, and a plurality of interlayer connection conductors VG and VSB. The insulator layer 14 is provided with the first signal conductor pattern 30A, ground conductor patterns 24E1 and 24E2, and a plurality of interlayer connection conductors VG and VSB. The insulator layer 15 is provided with a lower ground conductor pattern 22, and a plurality of interlayer connection conductors VG, VSA, and VSB.

The upper ground conductor pattern 21 includes a plurality conductor openings CW. In other words, the upper ground conductor pattern 21 is provided in the shape of a ladder or a mesh pattern. The first end portion of the upper ground conductor pattern 21 is provided as an upper ground conductor pattern 21E1 of the first connection portion CN1. Similarly, the second end portion of the upper ground conductor pattern 21 is provided as an upper ground conductor pattern 21E2 of the second connection portion CN2. The first end portion of the middle ground conductor pattern 23 is provided as a middle ground conductor pattern 23E1 of the first connection portion CN1. Similarly, the second end portion of the middle ground conductor pattern 23 is provided as a middle ground conductor pattern 23E2 of the second connection portion CN2. The first end portion of the lower ground conductor pattern 22 is provided as a lower ground conductor pattern 22E1 of the first connection portion CN1. Similarly, the second end portion of the lower ground conductor pattern 22 is provided as a lower ground conductor pattern 22E2 of the second connection portion CN2.

The upper ground conductor patterns 21, 21E1, and 21E2 are respectively connected to the middle ground conductor patterns 23, 23E1, and 23E2 through the plurality of interlayer connection conductors VG. The middle ground conductor patterns 23, 23E1, and 23E2 are respectively connected to the lower ground conductor patterns 22, 22E1, and 22E2 through a plurality of interlayer connection conductors VG.

The first signal conductor pattern 30A, the lower ground conductor pattern 22, the middle ground conductor pattern 23, and the insulator layers 14 and 15 provide a first signal line. In addition, the second signal conductor pattern 30B, the upper ground conductor pattern 21, the middle ground conductor pattern 23, and the insulator layers 12 and 13 provide a second signal line.

The first end of the first signal conductor pattern 30A is connected to the first signal conductor pattern 31A through the interlayer connection conductor VSA. Similarly, the second end of the first signal conductor pattern 30A is connected to the first signal conductor pattern 32A through the interlayer connection conductor VSA.

The first end of the second signal conductor pattern 30B is connected to the second signal conductor pattern 31B through the plurality of interlayer connection conductors VSB. Similarly, the second end of the second signal conductor pattern 30B is connected to the second signal conductor pattern 32B through the plurality of interlayer connection conductors VSB.

A protective film 9 includes openings H11A, H11B, H12A, and H12B, a plurality of openings H24, and a plurality of openings H1. The plurality of openings H24 partially expose the lower ground conductor patterns 22E1 and 22E2 provided on the insulator layer 15, and the openings H11A and H12A expose the first signal conductor patterns 31A and 32A provided on the insulator layer 15. Similarly, the openings H11B and H12B expose the second signal conductor patterns 31B and 32B provided on the insulator layer 15. The first signal conductor patterns 31A and 32A are included as a signal terminal of the first signal conductor pattern 30A, and the second signal conductor patterns 31B and 32B are included as a signal terminal of the second signal conductor pattern 30B. The lower ground conductor patterns 22E1 and 22E2 exposed from the plurality of openings H24 are each included as a ground terminal. The plurality of openings H1 partially expose the lower ground conductor pattern 22 provided on the insulator layer 15. The exposed portions are the electrical-element-side bonding patterns B1.

According to the structure described above, the electrical element 104A may be implemented as a flat or substantially flat cable provided with the first signal line and the second signal line.

As shown in FIG. 10A and FIG. 11, the lower ground conductor pattern 22E1 is provided between the first signal conductor pattern 31A and the second signal conductor pattern 31B, and the lower ground conductor pattern 22E2 is provided between the first signal conductor pattern 32A and the second signal conductor pattern 32B. In addition, the ground terminals (exposed portions of the plurality of openings H24) are arranged adjacent to the signal terminal (the first signal conductor patterns 31A and 32A) of the first signal conductor pattern 30A and the signal terminal (the second signal conductor patterns 31B and 32B) of the second signal conductor pattern 30B. Accordingly, the crosstalk between the first signal line and the second signal line is able to be significantly reduced or prevented.

Since a transmission loss generally becomes larger as the frequency of a transmission signal increases, it is preferred to assign the two signal lines such that a signal with a high frequency should passes through the first signal line and a signal with a low frequency should passes through the second signal line. Thus, the transmission loss that occurs in the second signal line with a long wiring length is able to be significantly reduced or prevented from influencing the characteristic impedance.

The electrical element 104B shown in FIG. 10B and the electrical element 104A are different from each other in the positional relationship between the first connection portion CN1 and the transmission line portion CA and between the second connection portion CN2 and the transmission line portion CA. In the electrical element 104B, the first connection portion CN1 and the second connection portion CN2 are provided in line symmetry or substantial line symmetry with respect to a center line, as an axis, in the extending direction of the transmission line portion CA.

In the electrical element 104B shown in FIG. 10B, the three sides of the wide connection portions CN1 and CN2 and a first side surface of the narrow transmission line portion CA provide a planar space OP1. Similarly, the three sides of the wide connection portions CN1 and CN2 and a second side surface of the narrow transmission line portion CA provide a planar space OP2. In the electrical element 104A shown in FIG. 10A, each of the connection portions CN1 and CN2 is offset with respect to the transmission line portion CA in the direction perpendicular or substantially perpendicular to a central axis of the extending direction of the transmission line portion CA, and the offset direction of the first connection portion CN1 is opposite to the offset direction of the second connection portion CN2 with respect to the central axis. Accordingly, the two sides of the wide connection portion CN1 and the first side surface of the narrow transmission line portion CA provide a planar space OP1. Similarly, the two sides of the wide connection portion CN2 and the second side surface of the narrow transmission line portion CA provide a planar space OP2. According to the electrical element 104A shown in FIG. 10A, since a larger empty space is able to be provided as compared with the electrical element 104B, the flexibility of arrangement of a peripheral member is able to be increased.

Fifth Preferred Embodiment

Figure 12A:
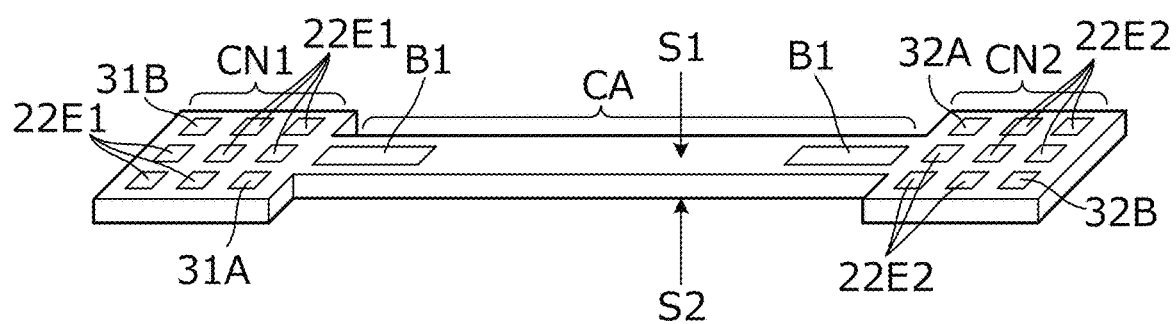
FIG. 12A is a perspective view of an electrical element according to a fifth preferred embodiment of the present invention.
Figure 12B:
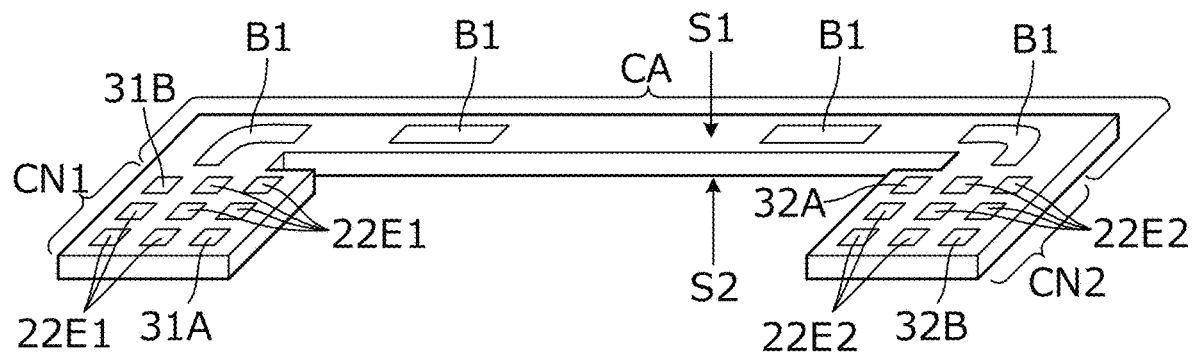
FIG. 12B is a perspective view of another electrical element according to the fifth preferred embodiment of the present invention.

FIG. 12A is a perspective view of an electrical element 105A according to a fifth preferred embodiment of the present invention and FIG. 12B is a perspective view of another electrical element 105B according to the fifth preferred embodiment.

The electrical element 105A of the fifth preferred embodiment is different in the pattern of the electrical-element-side bonding pattern B1 from the electrical element 104B shown in FIG. 10B in the fourth preferred embodiment. In the fifth preferred embodiment, the electrical-element-side bonding patterns B1 are not provided in the central portion of the transmission line portion CA. In other words, the electrical-element-side bonding patterns B1 are respectively provided around the first connection portion CN1 and around the second connection portion CN2 of the transmission line portion CA.

In the electrical element 105A, the electrical-element-side bonding patterns B1 are provided adjacent to or in a vicinity of the first connection portion CN1 and adjacent to or in a vicinity of the second connection portion CN2 of the transmission line portion CA, and are respectively bonded to the substrate-side bonding patterns. In other words, in the electrical element 105A, the electrical-element-side bonding patterns B1 are arranged closer to the first connection portion CN1 and the second connection portion CN2 than to the central portion in the length direction of the electrical element 105. Positional misalignment between the first connection portion CN1 and the second connection portion CN2, and the substrate, is able to be significantly reduced, minimized, or prevented by a self-alignment feature of the electrical-element-side bonding patterns B1. Therefore, the connection between the lower ground conductor pattern 22E1, the first signal conductor pattern 31A, and the second signal conductor pattern 31B of the first connection portion CN1, and the ground conductor pattern and the signal conductor pattern of the third connection portion that are included on the substrate is stabilized. Similarly, the connection between the lower ground conductor pattern 22E2, the first signal conductor pattern 32A, and the second signal conductor pattern 32B of the second connection portion CN2, and the ground conductor pattern and the signal conductor pattern of the fourth connection portion that are included on the substrate is stabilized.

In addition, the arrangement of the electrical-element-side bonding pattern B1 adjacent to or in a vicinity of the first connection portion CN1 and the second connection portion CN2 significantly reduces or prevents the deformation of the boundary between the first connection portion CN1 and the transmission line portion CA or the boundary of the second connection portion CN2 and the transmission line portion CA, the boundaries being portions on which stress such as vibration is likely to concentrate after the electrical element 105A is mounted on the substrate. Therefore, the connection between the lower ground conductor pattern 22E1, the first signal conductor pattern 31A, and the second signal conductor pattern 32B of the first connection portion CN1, and the ground conductor pattern and the signal conductor pattern of the third connection portion that are included on the substrate is stabilized. Similarly, the connection between the lower ground conductor pattern 22E2, the first signal conductor pattern 32A, and the second signal conductor pattern 32B of the second connection portion CN2, and the ground conductor pattern and the signal conductor pattern of the fourth connection portion that are included on the substrate is stabilized.

While the electrical element 105A in which the electrical-element-side bonding patterns B1 are respectively provided adjacent to or in a vicinity of the first connection portion CN1 and adjacent to or in a vicinity of the second connection portion CN2 of the transmission line portion CA as described above, the electrical element is not limited to this specific configuration. The electrical-element-side bonding patterns B1 may be provided only adjacent to or in a vicinity of the first connection portion CN1 of the transmission line portion CA, or may be provided only adjacent to or in a vicinity of the second connection portion CN2 of the transmission line portion CA. In addition, in order to obtain the best effects from the limited number of substrate-side bonding patterns B2, the electrical-element-side bonding patterns B1 may preferably be provided adjacent to or in a vicinity of either the first connection portion CN1 or the second connection portion CN2 or adjacent to or in a vicinity of both the first connection portion CN1 and the second connection portion CN2.

The electrical element 105B shown in FIG. 12B and the electrical element 105A are different from each other in the positional relationship between the first connection portion CN1 and the transmission line portion CA and between the second connection portion CN2 and the transmission line portion CA. In the electrical element 105B shown in FIG. 12B, the first connection portion CN1 and the second connection portion CN2 are provided in mutually shifted positions in the direction perpendicular or substantially perpendicular to a central axis of the extending direction of the transmission line portion CA with respect to the transmission line portion CA, and the shift direction of the first connection portion CN1 is the same or substantially the same as the shift direction of the second connection portion CN2 on the basis of the central axis. In other words, the planar shape of the electrical element 105B is U-shaped.

The electrical-element-side bonding patterns B1 of the electrical element 105B are provided in the extending direction of the transmission line portion CA, and are provided adjacent to or in a vicinity of the first connection portion CN1 and adjacent to or in a vicinity of the second connection portion CN2 of the transmission line portion CA.

Although the planar shape of the electrical element 105B is different from the shape of the electrical element 105A, the basic configuration of electrical element 105B is the same or substantially the same as the configuration of the electrical element 105A. Thus, according to the fifth preferred embodiment, the electrical element includes two connection portions that are not arranged on the opposite ends of an elongated portion.

It is noted that "adjacent to or in a vicinity of the first connection portion of the transmission line portion" and "adjacent to or in a vicinity of the second connection portion of the transmission line portion" do not indicate only an extreme vicinity of the first connection portion CN1 and the second connection portion CN2 in the transmission line portion CA. For example, the range from the boundary between the first connection portion CN1 and the transmission line portion CA to one-third of the length in the extending direction of the transmission line portion CA is referred to as "adjacent to or in a vicinity of the first connection portion of the transmission line portion," and the range from the boundary between the second connection portion CN2 and the transmission line portion CA to one-third of the length in the extending direction of the transmission line portion CA is referred to as "adjacent to or in a vicinity of the second connection portion of the transmission line portion".

Sixth Preferred Embodiment

Figure 13:
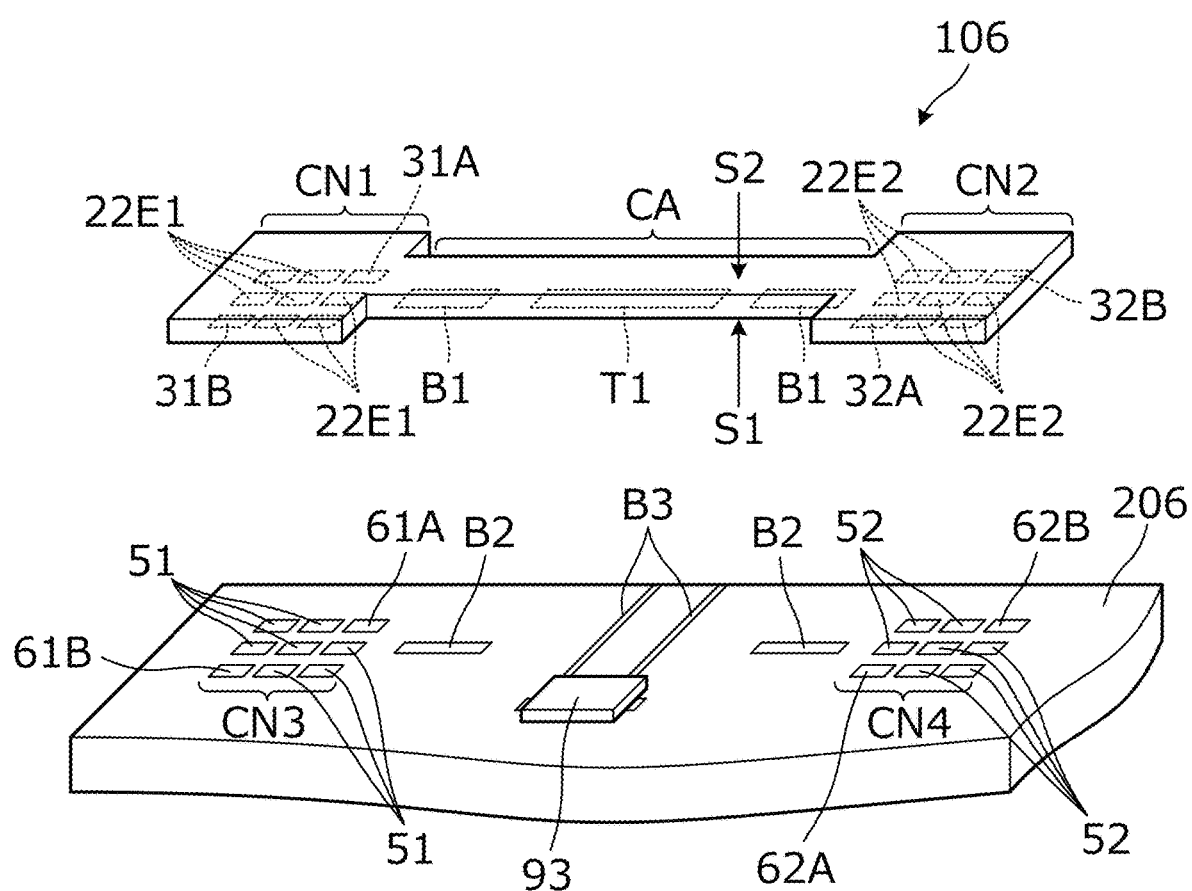
FIG. 13 is an exploded perspective view of a main portion of an electronic apparatus according to a sixth preferred embodiment of the present invention.

A sixth preferred embodiment of the present invention provides an example of an electrical element provided with a double-sided adhesive tape in the transmission line portion and an electronic apparatus provided with such an electrical element. FIG. 13 is an exploded perspective view of a main portion of an electronic apparatus according to the sixth preferred embodiment, and FIG. 14 is a perspective view of the main portion of the electronic apparatus 306 according to the sixth preferred embodiment.

Figure 14:
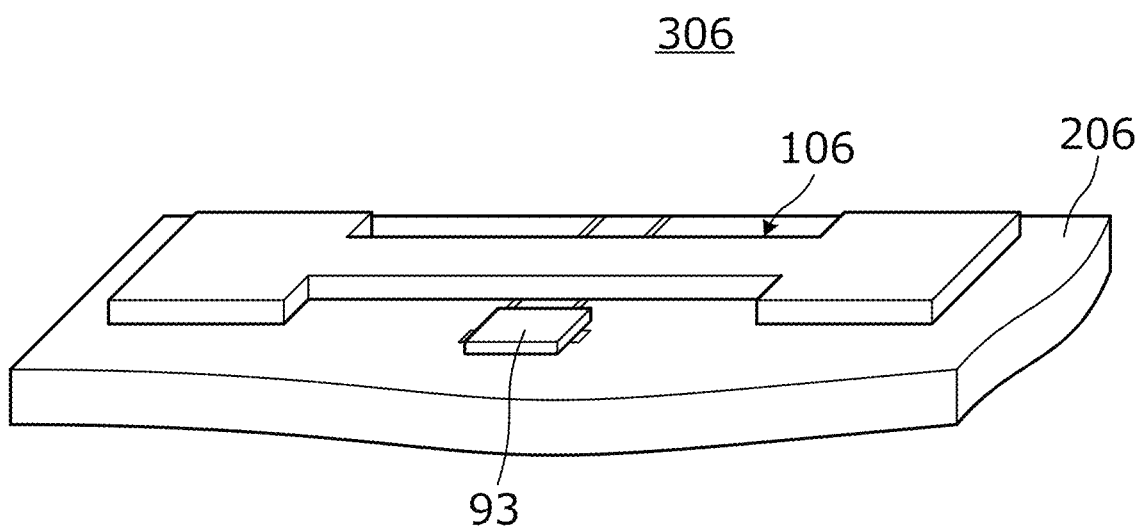
FIG. 14 is a perspective view of the main portion of the electronic apparatus according to the sixth preferred embodiment of the present invention.

As shown in FIG. 14, the electronic apparatus 306 according to the sixth preferred embodiment is provided with a substrate 206, and an electrical element 106 and a circuit element 93 that are mounted on the substrate 206.

The electrical element 106 according to the sixth preferred embodiment is different from the electrical element 105A shown in FIG. 12A in the fifth preferred embodiment in that the electrical element 106 further includes a double-sided adhesive tape T1. The double-sided adhesive tape T1 is attached on the central portion of the transmission line portion CA. In other words, the double-sided adhesive tape T1 is arranged in a portion in which the transmission line portion CA does not include electrical-element-side bonding patterns B1.

The substrate 206 is provided with a third connection portion CN3, a fourth connection portion CN4, a substrate-side bonding pattern B2, the circuit element 93, and a substrate-side wiring pattern B3 to which the circuit element 93 are connected. The substrate-side wiring pattern B3 is a conductor pattern extending in a vertical direction, that is, a direction perpendicular or substantially perpendicular to the extending direction of the transmission line portion CA. The terminal of the circuit element 93 is soldered to the substrate-side wiring pattern B3 and is electrically connected.

The third connection portion CN3 is provided by a plurality of ground conductor patterns 51 and signal conductor patterns 61A and 61B. In addition, the fourth connection portion CN4 is provided by a plurality of ground conductor patterns 52 and signal conductor patterns 62A and 62B.

The lower ground conductor pattern 22E1, the first signal conductor pattern 31A, and the second signal conductor pattern 31B of the first connection portion CN1 are respectively soldered to the plurality of ground conductor patterns 51 and the signal conductor patterns 61A and 61B of the third connection portion CN3 and the lower ground conductor pattern 22E2, the first signal conductor pattern 32A, and the first signal conductor pattern 32B of the second connection portion CN2 are respectively soldered to the plurality of ground conductor patterns 52 and the signal conductor patterns 62A and 62B of the fourth connection portion CN4.

In the sixth preferred embodiment, the central portion of the transmission line portion CA is connected on the substrate 206 by the double-sided adhesive tape T1. Accordingly, a positional shift of the transmission line portion CA is significantly reduced or prevented and the shape of the electrical element 106 kept constant since the transmission line portion CA is able to be bonded to the substrate 206 by the double-sided adhesive tape T1 even, for example, if there is no space to provide a substrate-side bonding pattern B2 on a surface of the substrate 206, in other words, even when the substrate-side bonding pattern B2 is not able to be arranged due to the substrate-side wiring pattern B3 in the sixth preferred embodiment.

It is noted that, while an example in which one double-sided adhesive tape T1 is arranged in the central portion of the transmission line portion CA is described above in the sixth preferred embodiment, the arrangement of the double-sided adhesive tape T1 is not limited to this example. The electrical element may be provided with a plurality of double-sided adhesive tapes T1, and the double-sided adhesive tape T1 may be arranged in a portion other than the central portion of the transmission line portion CA.

Seventh Preferred Embodiment

Figure 15A:
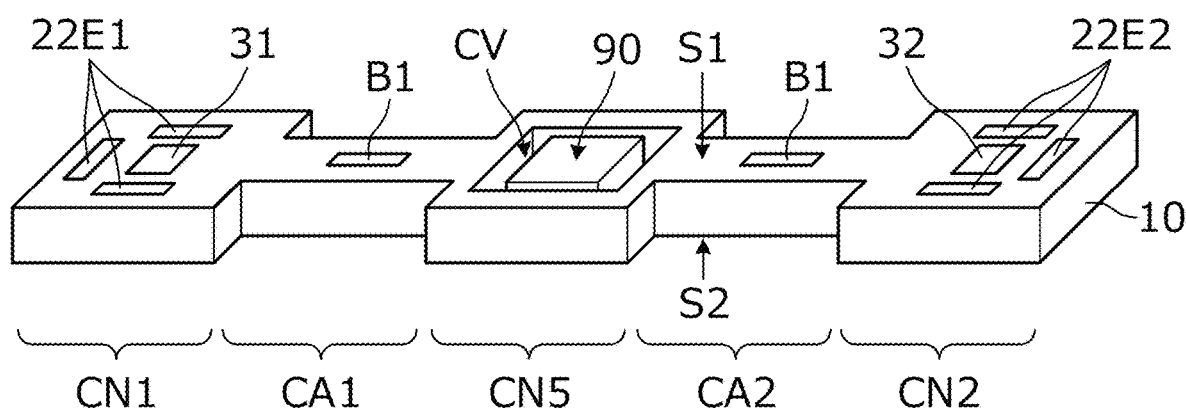
FIG. 15A is a perspective view of an electrical element according to a seventh preferred embodiment of the present invention.
Figure 15B:
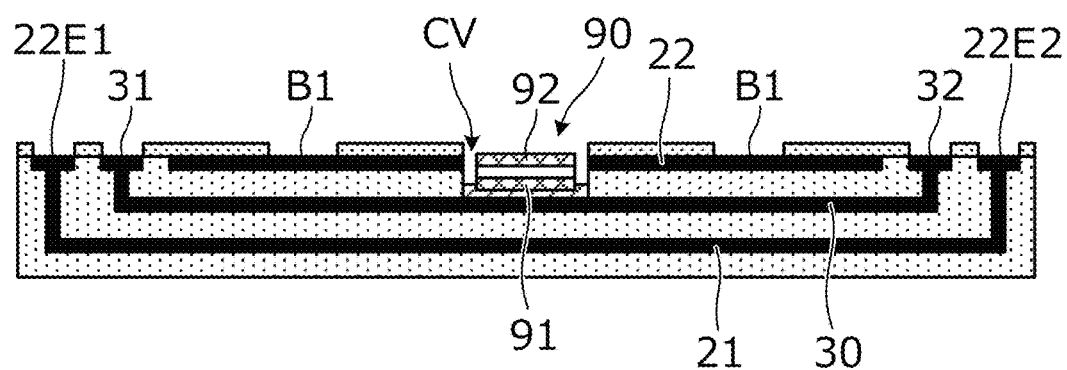
FIG. 15B is a sectional view of the electrical element according to the seventh preferred embodiment of the present invention.

A seventh preferred embodiment of the present invention provides an example of an electrical element provided with a chip component and an electronic apparatus provided with such an electrical element. FIG. 15A is a perspective view of an electrical element 107 according to the seventh preferred embodiment and FIG. 15B is a sectional view of the electrical element 107 according to the seventh preferred embodiment.

The electrical element 107 is provided with a base material 10 including a first principal surface S1 and a second principal surface S2 that are deformable and flat or substantially flat, and various conductor patterns in contact with the base material 10. The deformable base material 10 is a flexible base material that is elastically deformed or plastically deformed by an external force. The base material 10 is a laminate of liquid crystal polymer sheets, for example. The various conductor patterns are formed preferably by patterning copper foil attached on each of the liquid crystal polymer sheets, for example.

The electrical element 107 is provided with a first connection portion CN1, a second connection portion CN2, and a fifth connection portion CN5 that connect to a circuit included on the substrate on which the electrical element is to be mounted. In addition, the electrical element 107 is provided with a transmission line portion CA1 that connects to the first connection portion CN1 and the fifth connection portion CN5, and a transmission line portion CA2 that connects to the second connection portion CN2 and the fifth connection portion CN5. The transmission line portions CA1 and CA2 include electrical-element-side bonding patterns B1.

The first connection portion CN1, the second connection portion CN2, and the electrical-element-side bonding patterns B1 are exposed on the first principal surface S1 of the base material 10.

The first connection portion CN1 is provided by a lower ground conductor pattern 22E1 and a signal conductor pattern 31. In addition, the second connection portion CN2 is provided by a lower ground conductor pattern 22E2 and a signal conductor pattern 32.

The fifth connection portion CN5 includes a cavity CV, and a chip component 90 is provided in the cavity CV. The chip component 90 has a first terminal 91 and a second terminal 92, and the first terminal 91 is connected to a predetermined position of the signal conductor pattern 30. The second terminal 92 is exposed. The second terminal of the chip component 90 has the same or the substantially same height as the lower ground conductor patterns 22E1 and 22E2, the signal conductor patterns 31 and 32, and the electrical-element-side bonding patterns B1.

Figure 16:
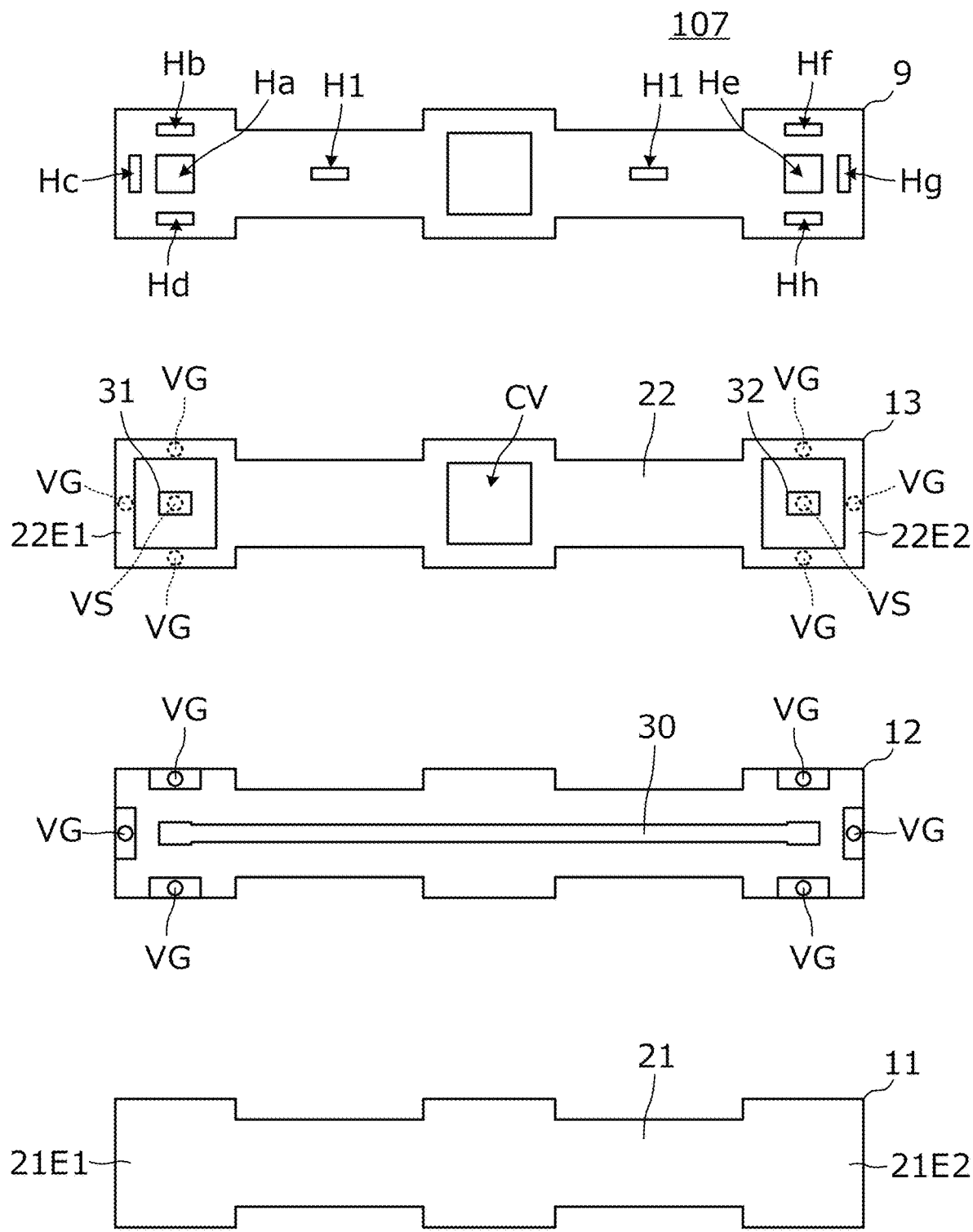
FIG. 16 is a plan view showing each insulator layer provided in the electrical element shown in FIGS. 15A and 15B and various conductor patterns that are included on each insulator layer.

FIG. 16 is a plan view showing each insulator layer provided in the electrical element 107 and various conductor patterns that are provided on each insulator layer.

The insulator layers 11, 12, and 13 are respectively provided with an upper ground conductor pattern 21, a signal conductor pattern 30, and a lower ground conductor pattern 22. The first end portion of the upper ground conductor pattern 21 is provided as an upper ground conductor pattern 21E1 of the first connection portion CN1. Similarly, the second end portion of the upper ground conductor pattern 21 is provided as an upper ground conductor pattern 21E2 of the second connection portion CN2. The first end portion of the lower ground conductor pattern 22 is provided as a lower ground conductor pattern 22E1 of the first connection portion CN1. Similarly, the second end portion of the lower ground conductor pattern 22 is provided as a lower ground conductor pattern 22E2 of the second connection portion CN2. The upper ground conductor patterns 21, 21E1, and 21E2 are respectively connected to the lower ground conductor patterns 22, 22E1, and 22E2 through a plurality of interlayer connection conductors VG.

The insulator layer 13 is provided with the signal conductor patterns 31 and 32 of the first connection portion CN1 and the second connection portion CN2. The signal conductor patterns 31 and 32 are respectively connected to the both ends of the signal conductor pattern 30 through an interlayer connection conductor VS.

A protective film 9 includes openings Ha, Hb, Hc, Hd, He, Hf, Hg, and Hh, and a plurality of openings H1. The openings Hb, Hc, and Hd partially expose the lower ground conductor pattern 22E1 provided on the insulator layer 13, and the opening Ha exposes the signal conductor pattern 31 provided on the insulator layer 13. Similarly, the openings Hf, Hg, and Hh partially expose the lower ground conductor pattern 22E2 provided on the insulator layer 13, and the opening He exposes the signal conductor pattern 32 provided on the insulator layer 13.

The plurality of openings H1 partially expose the lower ground conductor pattern 22 provided on the insulator layer 13. The exposed portions are the electrical-element-side bonding patterns B1.

The insulator layer 13 includes a cavity CV, which is a through hole in the insulator layer 13. The first terminal 91 of the chip component 90 that is put into the cavity CV is electrically connected to the signal conductor pattern 30.

Figure 17:
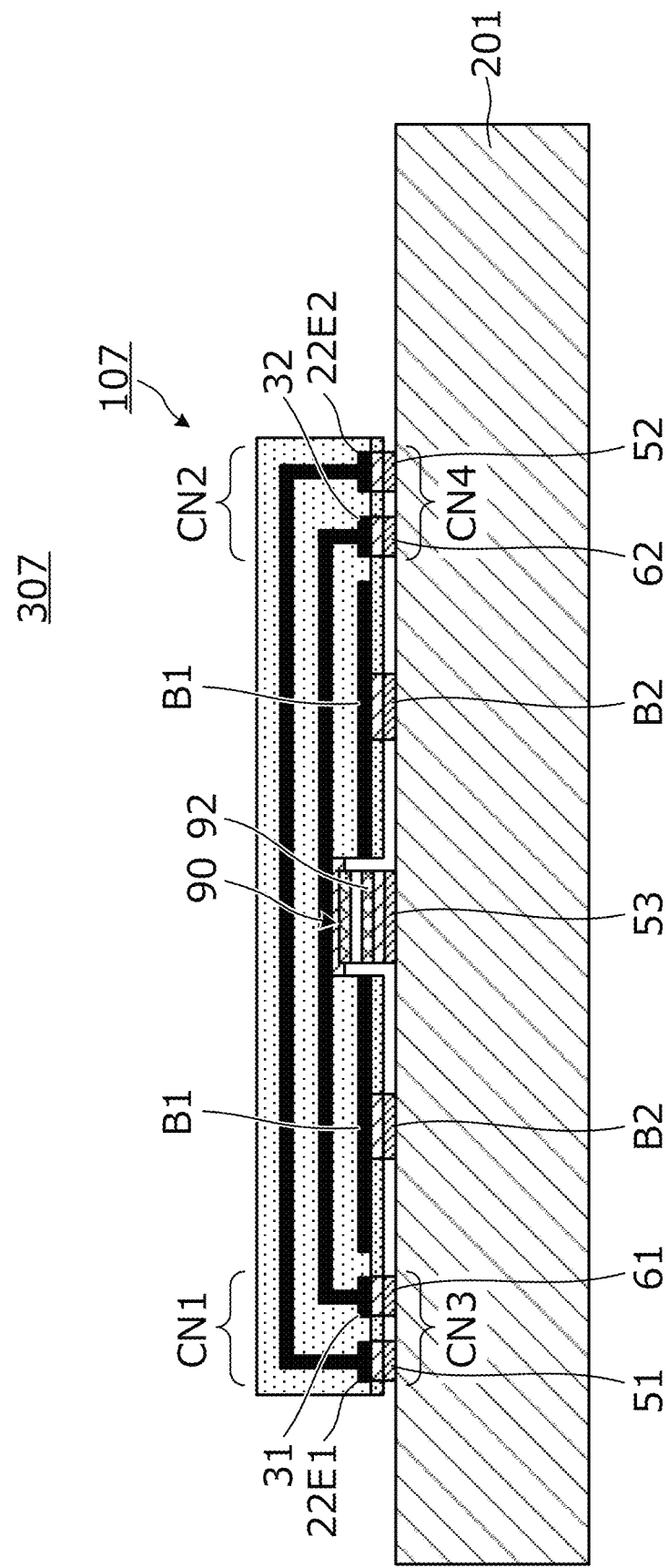
FIG. 17 is a sectional view showing the electrical element shown in FIGS. 15A and 15B mounted on a substrate.

FIG. 17 is a sectional view of an electronic apparatus 307 with an electrical element 107 mounted on a substrate 201. The substrate 201 is provided with a third connection portion CN3 to which the first connection portion CN1 of the electrical element 107 is connected, a fourth connection portion CN4 to which the second connection portion CN2 of the electrical element 107 is connected, and a substrate-side bonding pattern B2 to which the electrical-element-side bonding patterns B1 of the electrical element 107 are bonded, and a fifth connection portion 53.

The third connection portion CN3 is provided by a ground conductor pattern 51 and a signal conductor pattern 61. In addition, the fourth connection portion CN4 is provided by a ground conductor pattern 52 and a signal conductor pattern 62. The ground conductor patterns 51 and 52 and the signal conductor patterns 61 and 62 may each include a pad-shaped conductor pattern provided as a terminal.

The lower ground conductor pattern 22E1 and the signal conductor pattern 31 of the first connection portion CN1 are respectively soldered to the ground conductor pattern 51 and the signal conductor pattern 61 of the third connection portion CN3 and the lower ground conductor pattern 22E2 and the signal conductor pattern 32 of the second connection portion CN2 are respectively soldered to the ground conductor pattern 52 and the signal conductor pattern 62 of the fourth connection portion CN4. The second terminal 92 of the chip component 90 is soldered to the fifth connection portion 53 on the substrate 201. In the seventh preferred embodiment, the fifth connection portion 53 is a ground conductor pattern.

Figure 18:
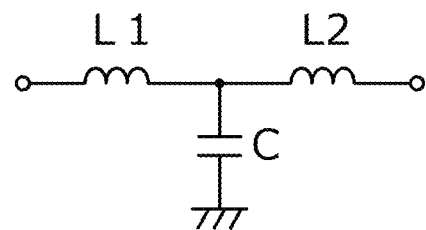
FIG. 18 is a simplified circuit diagram of a portion of an electronic apparatus according to the seventh preferred embodiment of the present invention.

FIG. 18 is a simplified circuit diagram of a portion of an electronic apparatus 307 according to the seventh preferred embodiment. In FIG. 18, the transmission line L1 is equivalent to a portion to the first connection portion CN1 and the third connection portion CN3 to the fifth connection portion 53. In FIG. 18, the transmission line L2 is equivalent to a portion to the second connection portion CN2 and the fourth connection portion CN4 to the fifth connection portion 53. The capacitor C is equivalent to the chip component 90.

According to the seventh preferred embodiment, it is possible to easily provide a circuit in which a circuit element is connected to a shunt, in a predetermined position of the transmission line.

Eighth Preferred Embodiment

An eighth preferred embodiment of the present invention provides an example of an electrical element provided by a particular conductor pattern of a connection portion, from among various conductor patterns provided on each insulator layer.

Figure 19:
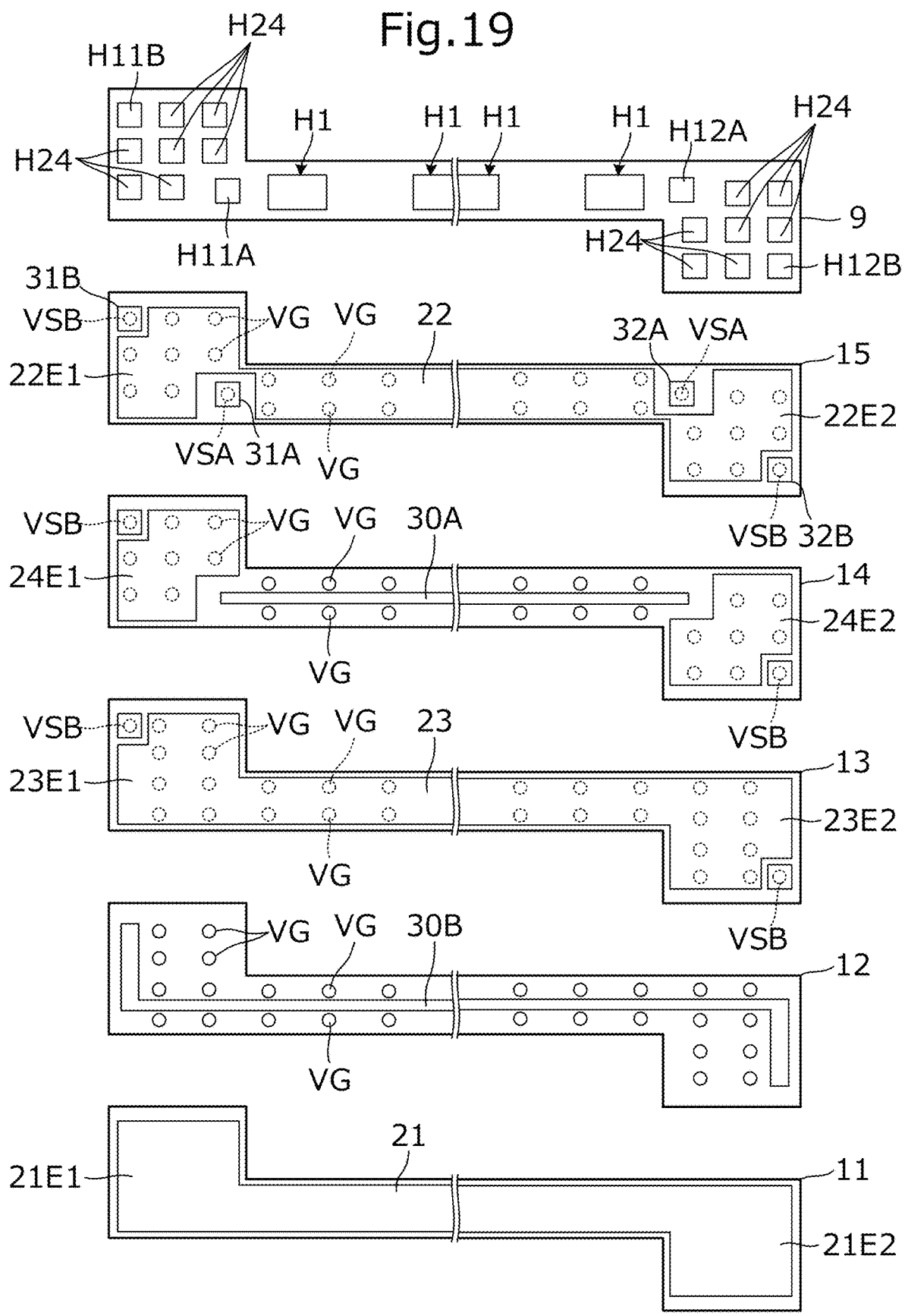
FIG. 19 is a plan view showing each insulator layer provided in an electrical element according to the eighth preferred embodiment of the present invention and various conductor patterns that are included on each insulator layer.

FIG. 19 is a plan view showing each insulator layer provided in an electrical element according to the eighth preferred embodiment and various conductor patterns that are provided on each insulator layer. The electrical element is particularly different in the conductor pattern of the connection portion from the electrical element shown in FIG. 11 in the fourth preferred embodiment.

In the eighth preferred embodiment, the distance between the interlayer connection conductor VSB linked to the second signal conductor pattern 30B and the surrounding lower ground conductor patterns 22E1 is smaller than the distance between the interlayer connection conductor VSA linked to the first signal conductor pattern 30A and the surrounding lower ground conductor patterns 22E1.

In the eighth preferred embodiment, the upper ground conductor pattern 21 does not include the plurality conductor openings CW shown in FIG. 11.

Since the interlayer connection conductor VSB is longer in the laminating direction compared with the interlayer connection conductor VSA, the interlayer connection conductor VSB has a larger inductance component compared with the interlayer connection conductor VSA. In contrast, the capacitance component generated between the interlayer connection conductor VSB, and the lower ground conductor pattern 22E1, the ground conductor pattern 24E1, and the middle ground conductor pattern 23E1 is larger than the capacitance component generated between the interlayer connection conductor VSA, and the lower ground conductor pattern 22E1, and the ground conductor pattern 24E1. Therefore, the impedance in the connection portion of the transmission line including the first signal conductor pattern 30A and the impedance in the connection portion of the transmission line including the second signal conductor pattern 30B are able to be matched.

Ninth Preferred Embodiment

A ninth preferred embodiment of the present invention, similar to the eighth preferred embodiment, provides an example of an electrical element including a conductor pattern of a connection portion in particular among the various conductor patterns provided on each insulator layer.

Figure 20:
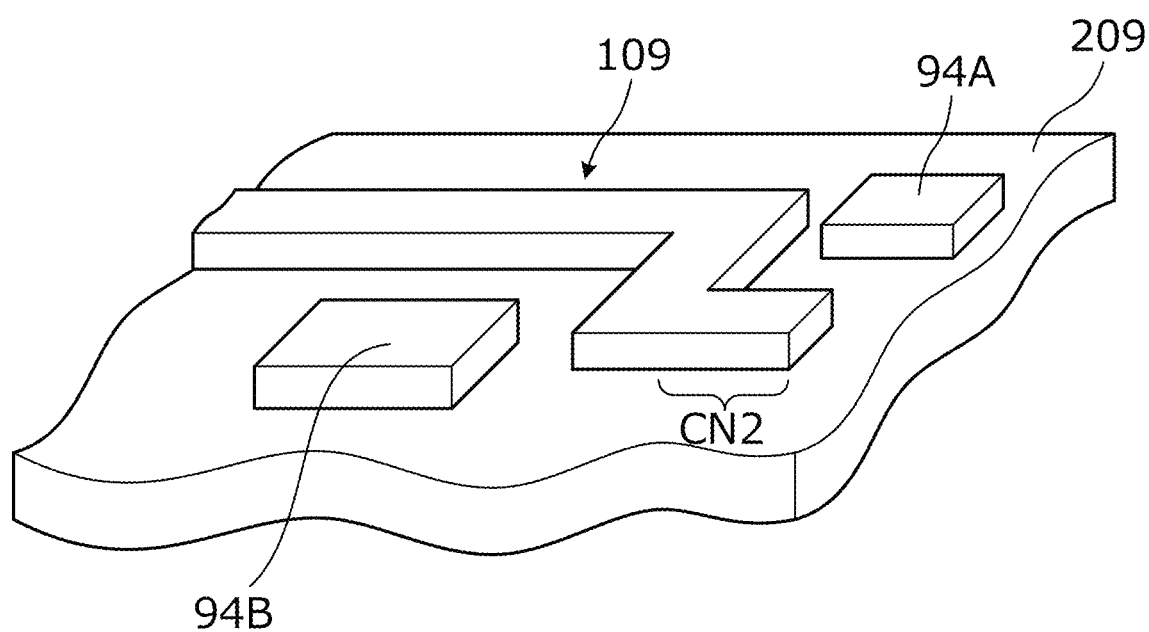
FIG. 20 is a perspective view of a main portion of an electronic apparatus according to a ninth preferred embodiment of the present invention.
Figure 21:
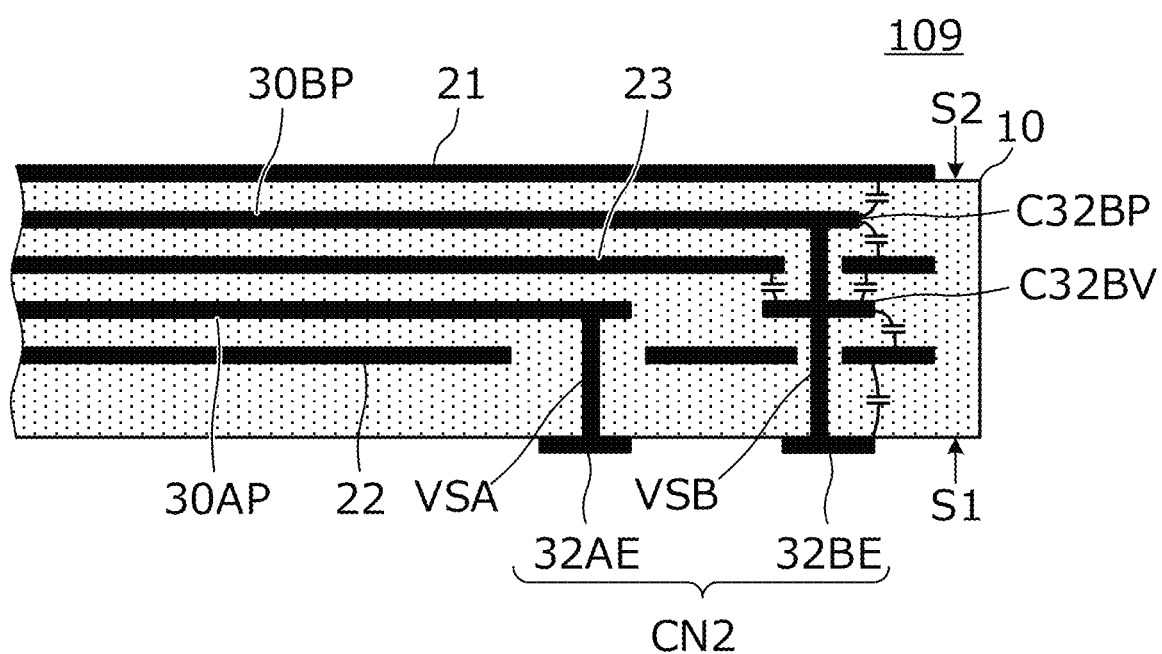
FIG. 21 is a sectional view of a vicinity of a second connection portion of an electrical element according to the ninth preferred embodiment of the present invention.

FIG. 20 is a perspective view of a main portion of an electronic apparatus according to the ninth preferred embodiment. FIG. 21 is a sectional view of a vicinity of a second connection portion CN2 of an electrical element 109 according to the ninth preferred embodiment. The electrical element 109 according to the ninth preferred embodiment is different in the conductor pattern of the connection portion and the number of laminated layers of the insulator layer that provides a base material from the electrical element 108 described in the eighth preferred embodiment. The electrical element 109 and other surface mounting components 94A and 94B and the like are mounted on the substrate 209.

The electrical element 109 shown in FIG. 21 is provided with a base material 10 including a first principal surface S1 and a second principal surface S2 that are deformable and flat or substantially flat, and various conductor patterns in contact with the base material 10. The second connection portion CN2 of the electrical element 109 includes second connection end portions 32AE and 32BE, as shown in FIG. 21. The second connection end portions 32AE and 32BE are respectively connected to the substrate 209.

Figure 22:
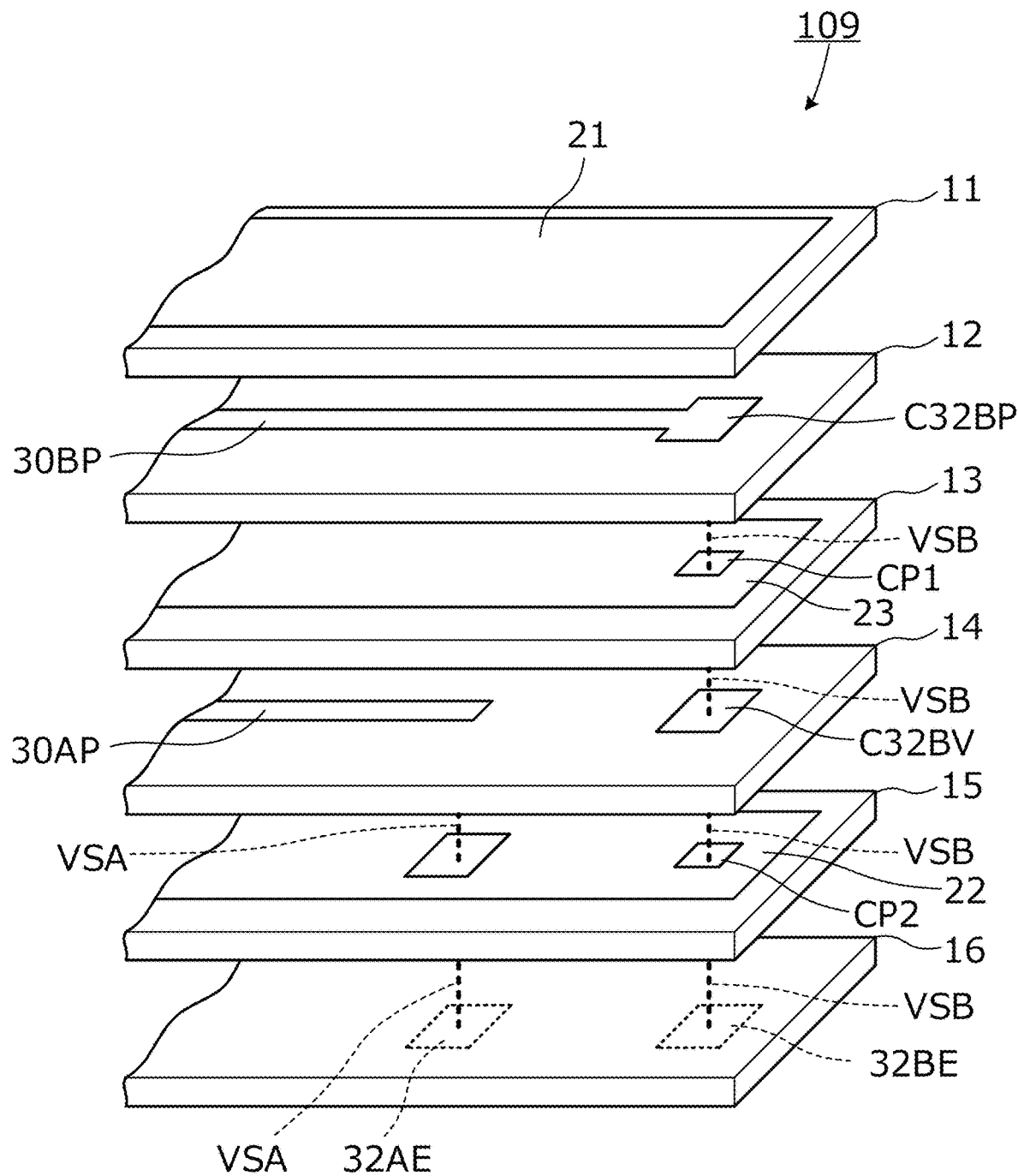
FIG. 22 is an exploded perspective view of the second connection portion of the electrical element shown in FIG. 21.

FIG. 22 is an exploded perspective view of the second connection portion CN2 of the electrical element 109.

The insulator layer 11 is provided with an upper ground conductor pattern 21. The insulator layer 12 is provided with a second linear conductor 30BP and an interlayer connection conductor VSB. The second linear conductor 30BP has a flat conductor C32BP that is a planar conductor pattern provided on one end of the second linear conductor 30BP. The insulator layer 13 is provided with the middle ground conductor patterns 23 and an interlayer connection conductor VSB. The insulator layer 14 is provided with a first linear conductor 30AP, a flat conductor C32BV, and interlayer connection conductors VSA and VSB. The flat conductor C32BV is a planar conductor pattern connected to the interlayer connection conductor VSB, as shown in FIG. 21. The insulator layer 15 is provided with a lower ground conductor pattern 22 and interlayer connection conductors VSA and VSB. The insulator layer 16 is provided with second connection end portions 32AE and 32BE and the interlayer connection conductors VSA and VSB. The second connection end portion 32AE is connected to one end of the interlayer connection conductor VSA, and the second connection end portion 32BE is connected to one end of the interlayer connection conductor VSB.

In the ninth preferred embodiment, the first linear conductor 30AP is parallel or substantially parallel to the first principal surface S1. The interlayer connection conductor VSA connects the first linear conductor 30AP and the first connection end portion (not shown) and connects the first linear conductor 30AP and the second connection end portion 32AE.

The first signal conductor pattern according to the ninth preferred embodiment is provided by the first linear conductor 30AP, the first connection end portion (not shown) exposed on the first principal surface S1 of the first connection portion, the second connection end portion 32AE exposed on the first principal surface S1 of the second connection portion CN2, and the first interlayer connection conductor, that is, the interlayer connection conductor VSA.

In the ninth preferred embodiment, the second linear conductor 30BP is parallel or substantially parallel to the first principal surface S1. In addition, the flat conductors C32BP and C32BV and the second connection end portion 32BE are equivalent to the "capacitance-generating flat conductor." The interlayer connection conductor VSB is equivalent to the "second interlayer connection conductor" that connects the second linear conductor 30BP and the first connection end portion (not shown) and connects the second linear conductor 30BP and the second connection end portion 32BE.

The second signal conductor pattern according to the ninth preferred embodiment is provided by the second linear conductor 30BP, the first connection end portion (not shown) exposed on the first principal surface S1 of the first connection portion (not shown), the second connection end portion 32BE exposed on the first principal surface S1 of the second connection portion CN2, and the second interlayer connection conductor (interlayer connection conductor VSB).

In addition, in the ninth preferred embodiment, the capacitance-generating flat conductors (that is, the flat conductors C32BP and C32BV and the second connection end portion 32BE) are conductor patterns each of which is a portion of the second signal conductor pattern and are also connected to a plurality of portions of the second signal conductor pattern. More specifically, each of the capacitance-generating flat conductors is a portion of the second linear conductor 30BP and is a conductor pattern provided at one end of second linear conductor connected with the second interlayer connection conductor, the second connection end portion 32BE, and a conductor pattern provided in the middle of the path of the second interlayer connection conductor.

The second linear conductor 30BP, as shown in FIG. 21, is arranged closer to the side of the second principal surface S2 than to the first linear conductor 30AP in the thickness direction (the vertical direction in FIG. 21) of the base material 10. Therefore, the line length of the second signal conductor pattern mainly provided by the second linear conductor 30BP and the second interlayer connection conductor is longer than the line length of the first signal conductor pattern mainly provided by the first linear conductor 30AP and the first interlayer connection conductor. Accordingly, the inductance component of the second signal conductor pattern is likely to be larger compared with the inductance component of the first signal conductor pattern.

In contrast, as shown in FIG. 21, as viewed in the thickness direction of the base material 10, a portion of the capacitance-generating flat conductor overlaps the ground conductor pattern, including the upper ground conductor pattern 21, the middle ground conductor pattern 23, and the lower ground conductor pattern 22.

In other words, since the capacitance-generating flat conductor includes the portion that faces the ground conductor pattern, a capacitance is respectively provided in a portion in which the capacitance-generating flat conductor and the ground conductor pattern face each other. Therefore, it is possible to determine and adjust regulated characteristic impedance (about 50Ω, for example) to be provided up to the end portion of the second signal conductor pattern by providing the capacitance-generating flat conductor that overlaps the ground conductor pattern in the second signal conductor pattern of which the path length is longer than the path length of the first signal conductor pattern.

While the electrical element in which a portion of the capacitance-generating flat conductor overlaps the ground conductor pattern is described above as an example in the ninth preferred embodiment, the electrical element is not limited to the specific features described above. The entire capacitance-generating flat conductor may overlap the ground conductor pattern.

In addition, in order to adjust the capacitance to be provided in the portion in which the capacitance-generating flat conductor and the ground conductor pattern face each other, by increasing an area of the capacitance-generating flat conductor or decreasing the size of the conductor opening portion (that is, the conductor opening portion CP1 of the middle ground conductor pattern 23, and the conductor opening portion CP2 of the lower ground conductor pattern 22, as shown in FIG. 21) of the ground conductor pattern, the area in which the capacitance-generating flat conductor and the ground conductor pattern face each other may be increased. In addition, the capacitance to be provided in the portion in which the capacitance-generating flat conductor and the ground conductor pattern face each other may be adjusted by adjusting a gap between the capacitance-generating flat conductor and the ground conductor pattern.

While an example in which the capacitance-generating flat conductors are the conductor pattern that is a portion of the second linear conductor 30BP, the conductor pattern connected in the middle of the path of the second interlayer connection conductor, and the second connection end portion 32BE is described above in the ninth preferred embodiment, the capacitance-generating flat conductors are not limited to the specific features described above. The capacitance-generating flat conductor may be any one of the conductor pattern that is a portion of the second linear conductor 30BP, the conductor pattern provided in the middle of the path of the second interlayer connection conductor, and the second connection end portion. In addition, while an example in which the electrical element 109 is provided with three ground conductor patterns (including the upper ground conductor pattern 21, the middle ground conductor pattern 23, and the lower ground conductor pattern 22) is described above in the ninth preferred embodiment, the number of ground conductor patterns is not limited to the specific features described above. The number of ground conductor patterns with which the electrical element is provided may be one or may be four or more.

In addition, while an example in which the capacitance-generating flat conductor is provided only on the side of the second connection portion CN2 of the electrical element 109 is described above in the ninth preferred embodiment, the capacitance-generating flat conductor is not limited to the specific features described above. The capacitance-generating flat conductor may be provided only on the side of the first connection portion (the first connection portion CN1 in FIG. 1, for example) of the electrical element. In other words, the capacitance-generating flat conductor is a portion of the second linear conductor 30BP and may be any one of the planar conductor pattern provided at another end, the first connection end portion (not shown), and the conductor pattern provided in the middle of the path of the interlayer connection conductor that connects the second linear conductor 30BP and the first connection end portion. Furthermore, the capacitance-generating flat conductor may be provided on both sides of the first connection portion CN1 and the second connection portion CN2 of the electrical element.

Tenth Preferred Embodiment

A tenth preferred embodiment of the present invention provides an example of a configuration in which a capacitance is generated between the ground conductor provided on the substrate and the electrical element, and another example in which the characteristic impedance of the end portion of the second signal conductor pattern is adjusted.

Figure 23:
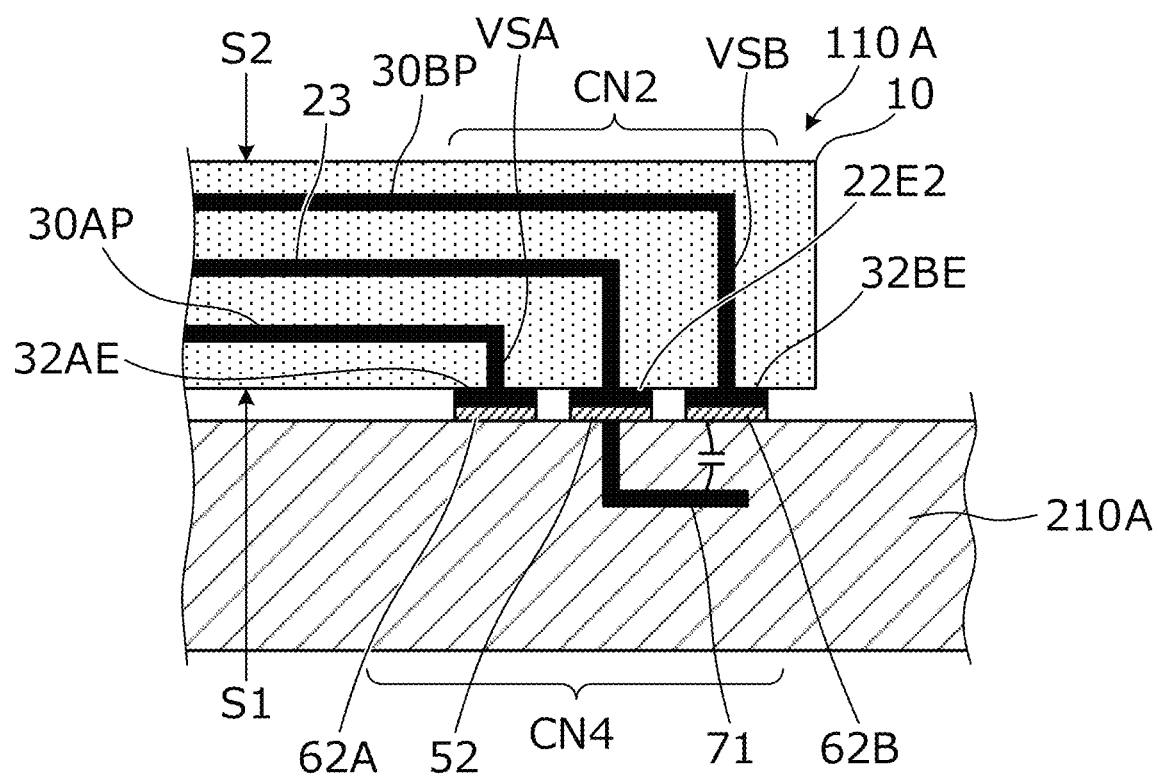
FIG. 23 is a sectional view showing an electrical element according to a tenth preferred embodiment of the present invention mounted on a substrate.

FIG. 23 is a sectional view showing an electrical element 110A mounted on a substrate 210A. The electrical element 110A is mounted on the substrate 210A. The substrate 210A includes a substrate-side ground conductor 71 inside the substrate 210A.

The electrical element 110A shown in FIG. 23 is provided with a base material 10 including a first principal surface S1 and a second principal surface S2 that are deformable and flat or substantially flat, and various conductor patterns in contact with the base material 10. The second connection portion CN2 of the electrical element 110A, as shown in FIG. 23, is provided by the second connection end portions 32AE and 32BE and the lower ground conductor pattern 22E2.

The second connection end portions 32AE and 32BE, and the lower ground conductor pattern 22E2 of the second connection portion CN2 are respectively soldered to the signal conductor patterns 62A and 62B and the ground conductor pattern 52 of the fourth connection portion CN4.

In the tenth preferred embodiment, the first linear conductor 30AP is parallel or substantially parallel to the first principal surface S1, and the second connection end portion 32AE is exposed on the first principal surface of the second connection portion CN2 and is connected to the substrate 210A. The interlayer connection conductor VSA is equivalent to the "first interlayer connection conductor" that connects the first linear conductor 30AP and the first connection end portion (not shown) and connects the first linear conductor 30AP and the second connection end portion 32AE.

The first signal conductor pattern according to the tenth preferred embodiment is provided by the first linear conductor 30AP, the first connection end portion exposed on the first principal surface S1 of the first connection portion and connected to the substrate 210A, the second connection end portion 32AE, and the first interlayer connection conductor (that is, the interlayer connection conductor VSA).

In the tenth preferred embodiment, the second linear conductor 30BP is parallel or substantially parallel to the first principal surface S1, and the second connection end portion 32BE is exposed on the first principal surface of the second connection portion CN2 and is connected to the substrate 210A. The interlayer connection conductor VSB is equivalent to the "second interlayer connection conductor" that connects the second linear conductor 30BP and the first connection end portion (not shown) and connects the second linear conductor 30BP and the second connection end portion 32BE.

The second signal conductor pattern according to the tenth preferred embodiment is provided by the second linear conductor 30BP, the first connection end portion (not shown) exposed on the first principal surface S1 of the first connection portion and connected to the substrate 210A, the second connection end portion 32BE, and the second interlayer connection conductor (that is, the interlayer connection conductor VSB).

The second linear conductor 30BP, as shown in FIG. 23, is arranged closer to the side of the second principal surface S2 than to the first linear conductor 30AP in the thickness direction (the vertical direction in FIG. 23) of the base material 10. Therefore, the line length of the second signal conductor pattern becomes longer than the line length of the first signal conductor pattern by at least the length of the second interlayer connection conductor. Therefore, the inductance component of the second signal conductor pattern is likely to be larger than the inductance component of the first signal conductor pattern and thus a shift in the characteristic impedance between the first signal conductor pattern and the second signal conductor pattern is likely to occur.

However, as shown in FIG. 23, a portion of the second connection end portion 32BE of the second signal conductor pattern, in a plane view of the substrate 210A, is adjacent to and overlapped with the substrate-side ground conductor 71.

In other words, since a portion of the second connection end portion 32BE and the substrate-side ground conductor 71 face each other, a capacitance is generated in a portion in which the second connection end portion 32BE of the second signal conductor pattern and the substrate-side ground conductor 71 face each other. Therefore, it is possible to determine and adjust regulated characteristic impedance (about 50Ω, for example) to be provided up to the end portion of the second signal conductor pattern by providing a capacitance between the second connection end portion 32BE of the second signal conductor pattern, and the substrate-side ground conductor 71.

While an example in which a portion of the second connection end portion 32BE of the second signal conductor pattern overlaps the ground conductor pattern is described above in the tenth preferred embodiment, the present invention is not limited to the specific features described above. The second connection end portion 32BE of the second signal conductor pattern may entirely overlap the substrate-side ground conductor 71.

In addition, in order to adjust the capacitance to be provided in the portion in which the second connection end portion 32BE of the second signal conductor pattern, and the substrate-side ground conductor 71 face each other, by increasing an area of the second connection end portion 32BE and the substrate-side ground conductor 71, the area in which the second connection end portion 32BE and the substrate-side ground conductor 71 face each other may be increased. The capacitance to be provided in the portion in which the second connection end portion 32BE and the substrate-side ground conductor 71 face each other may be adjusted by adjusting a gap of the second connection end portion 32BE of the second signal conductor pattern and the substrate-side ground conductor 71 that face each other.

While the electrical element 110A shown in FIG. 23 in which a capacitance generated only between the second connection end portion 32BE of the second signal conductor pattern and the substrate-side ground conductor 71 is described above as an example, the electrical element is not limited to the specific features described above. A capacitance may be provided only between the first connection end portion (not shown) of the second signal conductor pattern, and the substrate-side ground conductor 71. In addition, a capacitance may be provided both between the first connection end portion (not shown) of the second signal conductor pattern, and the substrate-side ground conductor 71 and between the second connection end portion 32BE and the substrate-side ground conductor 71.

Another example in which the characteristic impedance of the end portion of the second signal conductor pattern is adjusted is described below.

Figure 24A:
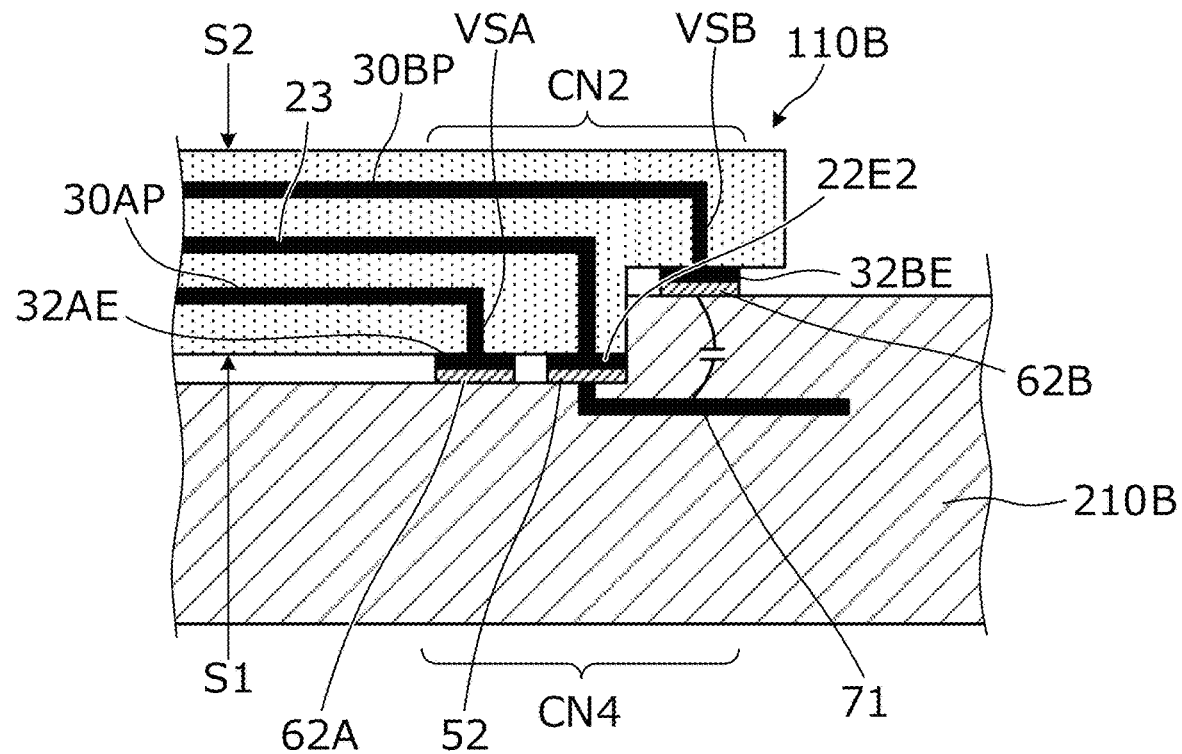
FIG. 24A is a sectional view showing an electrical element according to the tenth preferred embodiment of the present invention mounted on a substrate.
Figure 24B:
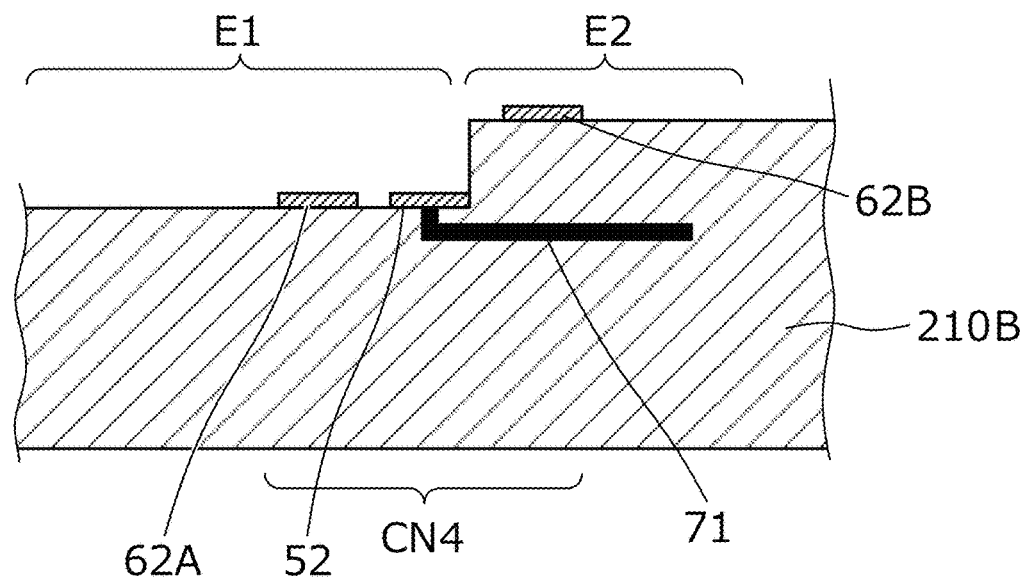
FIG. 24B is a sectional view showing the substrate before the electrical element is mounted on the substrate.

FIG. 24A is a sectional view showing an electrical element 110B mounted on a substrate 210B and FIG. 24B is a sectional view showing the substrate 210B before the electrical element 110B is mounted on the substrate 210B, in FIG. 24A. The substrate 210B is different in the structure of the mounting surface from the substrate 210A and the electrical element 110B is different in the structure of the first principal surface S1 from the electrical element 110A. The electrical element 110B is mounted on the substrate 210B. The substrate 210B includes a substrate-side ground conductor 71 inside.

The second connection end portions 32AE and 32BE, and the lower ground conductor pattern 22E2 of the second connection portion CN2 are respectively soldered to the signal conductor patterns 62A and 62B and the ground conductor pattern 52 of the fourth connection portion CN4.

The substrate 210B, as shown in FIG. 24B, includes a first area E1 and a second area E2. The first area E1 is an area including a portion (specifically, the signal conductor pattern 62A) that connects to the second connection end portion 32AE of the first signal conductor pattern, of the substrate 210B. The second area E2 is an area including a portion (specifically, the signal conductor pattern 62B) that connects to the second connection end portion 32BE of the second signal conductor pattern, of the substrate 210B.

As shown in FIG. 24A and FIG. 24B, the height of the mounting surface of the second area E2 of the substrate 210B is higher than the height of the mounting surface of the first area E1, and the first principal surface S1 of the electrical element 110B mounted on the substrate 210B is arranged along the first area E1 and the second area E2 of the substrate 210B. Therefore, the length of the second interlayer connection conductor (that is, the interlayer connection conductor VSB) of the second connection portion CN2 is shorter than the length of the second interlayer connection conductor of the second connection portion CN2 in the electrical element 110A shown in FIG. 23.

In the electrical element 110B, a total length of the second interlayer connection conductor (that is, a total length of the interlayer connection conductors VSB of both the first connection portion and the second connection portion CN2) approximates a total length (that is, a total length of the interlayer connection conductors VSA of both the first connection portion and the second connection portion CN2) of the first interlayer connection conductor (not shown).

Therefore, even if the second linear conductor 30BP is arranged closer to the side of the second principal surface S2 than to the first linear conductor 30AP in the thickness direction of the base material 10, the difference in line length between the first signal conductor pattern and the second signal conductor pattern is small. Thus, the inductance component of the second signal conductor pattern and the inductance component of the first signal conductor pattern are equal or substantially equal to each other, which reduces a shift in the characteristic impedance generated between the first signal conductor pattern and the second signal conductor pattern.

The first area E1 may be an area including a portion that connects to only the first connection end portion of the first signal conductor pattern, of the substrate 210B, and may be an area including a portion that connects to both the first connection end portion and the second connection end portion of the first signal conductor pattern. In other words, the first area may be an area including a portion that connects to at least one of the first connection end portion and the second connection end portion of the first signal conductor pattern.

In addition, the second area E2 may be an area including a portion that connects to only the first connection end portion of the second signal conductor pattern, of the substrate 210B, and may be an area including a portion that connects to both the first connection end portion and the second connection end portion of the second signal conductor pattern. In other words, the second area may be an area including a portion that connects to at least one of the first connection end portion and the second connection end portion of the second signal conductor pattern.

Eleventh Preferred Embodiment

An eleventh preferred embodiment of the present invention provides an example of an electrical element including particular conductor patterns with different thicknesses in the laminating direction from among the various conductor patterns provided on each insulator layer.

Figure 25:
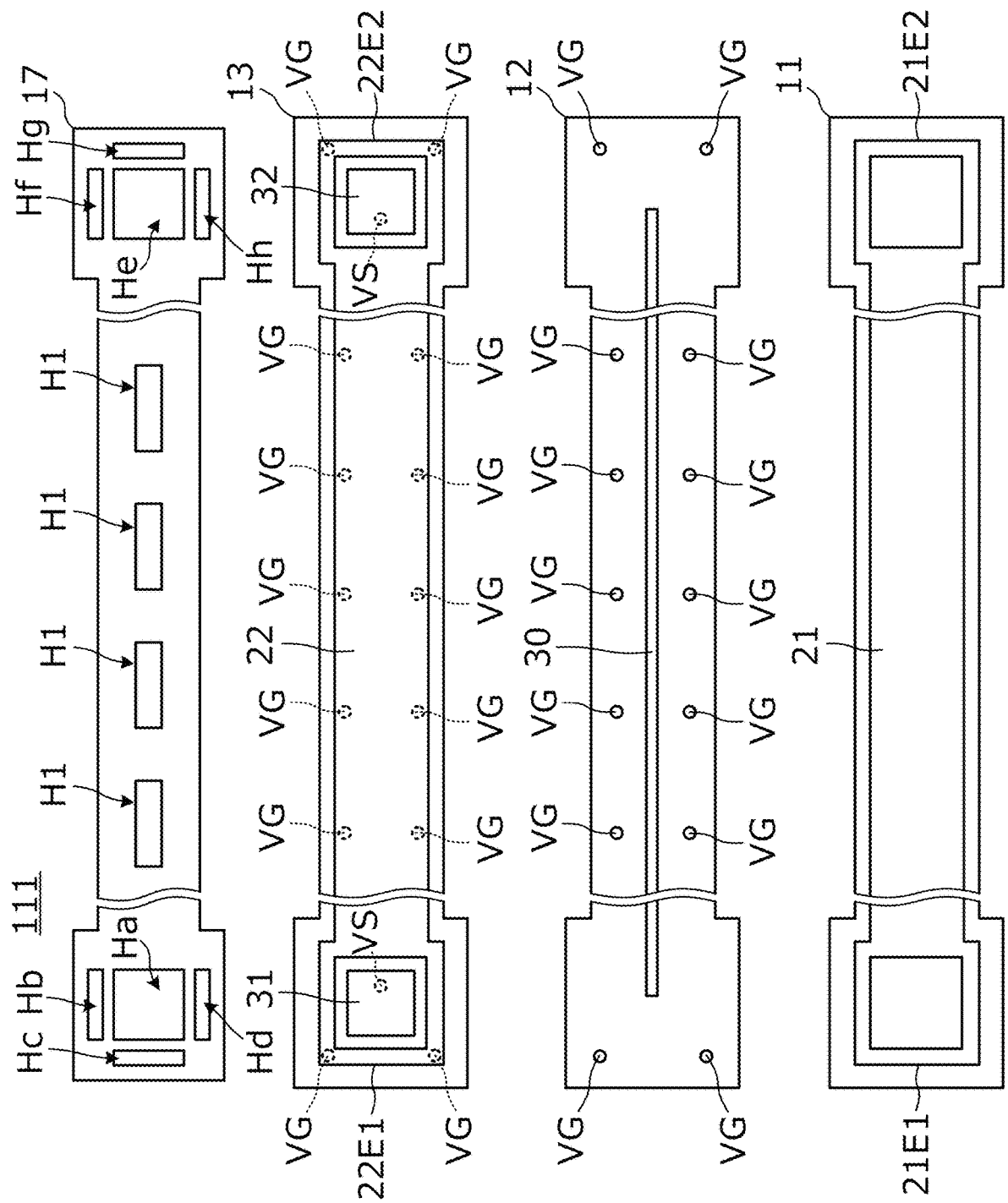
FIG. 25 is a plan view showing each insulator layer provided in an electrical element according to an eleventh preferred embodiment of the present invention and various conductor patterns that are included on each insulator layer.

FIG. 25 is a plan view showing each insulator layer provided in an electrical element 111 according to the eleventh preferred embodiment and various conductor patterns that are provided on each insulator layer. FIG. 26A is a sectional view of the electrical element 111 according to the eleventh preferred embodiment. FIG. 26B is a schematic sectional view showing the electrical element 111 mounted on the substrate 201. FIG. 26C is a schematic sectional view showing an electrical element 111C, as a reference example, mounted on the substrate 201.

The electrical element 111 according to the eleventh preferred embodiment is different in the pattern and thickness of the upper ground conductor pattern 21 from the electrical element 101 of the first preferred embodiment, as shown in FIG. 3 and FIG. 5. The upper ground conductor pattern 21 of the electrical element 111 shown in FIG. 25 does not include the conductor openings CW shown in FIG. 3. In the eleventh preferred embodiment, the thickness of the upper ground conductor pattern 21 is thicker than the thickness of the lower ground conductor pattern 22 or the signal conductor pattern 30 and has twice thickness in this example.

The openings Ha, Hb, Hc, Hd, He, Hf, Hg, and Hh and a plurality of openings H1 that are included in the cover film 17 are the same or substantially the same as the openings included in the protective film 9 shown in FIG. 3 in the first preferred embodiment. As shown in FIG. 26A, the openings H1 include pre-coated solder SO.

In the electrical element 111C of the reference example, the thickness of the upper ground conductor pattern 21 is the same or substantially the same as the thickness of the lower ground conductor pattern 22 or the signal conductor pattern 30.

Although the insulator layers 11, 12, and 13 and the cover film 17 are thermally pressed and pressure-bonded to one another, due to the contraction of the insulator layers 11, 12, and 13 and the cover film 17 as resin at the time of pressure bonding, if the ratios of resin are different in the sections in the laminating direction, the electrical element may warp so that the side with a high ratio of resin is located on the concave side.

In the electrical element 111 of the eleventh preferred embodiment, the relationship between a conductor ratio Ra1 of the conductor pattern on a side A1 of the mounting surface (such as the lower ground conductor pattern 22 and the signal conductor pattern 30) and a conductor ratio Ra2 of the conductor pattern on a side A2 opposite to the mounting surface (such as the upper ground conductor pattern 21) is given by Ra1≤Ra2. For example, the thickness of copper foil on the side A1 of the mounting surface is about 18 μm, and the thickness of copper foil on the side A2 opposite to the mounting surface is about 36 μm. In the eleventh preferred embodiment, the side A1 of the mounting surface is located from the center in the laminating direction of the entire resin layer including the cover film 17 to the side of the mounting surface, and the side A2 opposite to the mounting surface is located from the center to the side opposite to the mounting surface. In addition, the conductor pattern in the eleventh preferred embodiment does not include an interlayer connection conductor, such as a via, or pre-coated solder SO.

According to the eleventh preferred embodiment, a concave curvature on the surface of the side opposite to the mounting surface of the electrical element 111 is significantly reduced or prevented. In order to adjust the conductor ratios of the side A1 of the mounting surface and the side A2 opposite to the mounting surface, instead of adjusting the thickness of copper foil as in the eleventh preferred embodiment, a dummy conductor pattern may be provided on the A1 side or the A2 side.

A process of mounting the electrical element 111 on the substrate 201 is similar to the process shown in FIG. 5 of the first preferred embodiment. Since the electrical element 111C according to the reference example warps as shown in FIG. 26C, it may be more difficult to pick up and convey of the electrical element 111C by a vacuum adsorption chuck to which a tip tool 400 is attached. In addition, a bonding pattern of the electrical element 111C and the substrate-side bonding pattern may be less likely to contact each other and it may also be more difficult to perform bonding.

However, according to the eleventh preferred embodiment, as shown in FIG. 26B, the electrical element 111 has a high flatness. In particular, since, on the side opposite to the mounting surface, the flatness of the electrical element is able to be high according to the ratio of the conductor pattern as a rigid body is high, it is easier to pick up and convey the electrical element, and it is also easier to bond the electrical element to a substrate-side bonding pattern.

Twelfth Preferred Embodiment

A twelfth preferred embodiment of the present invention provides an example of handling an electrical element when the electrical element is carried and mounted on a substrate, in a process of manufacturing an electronic apparatus.

Figure 27:
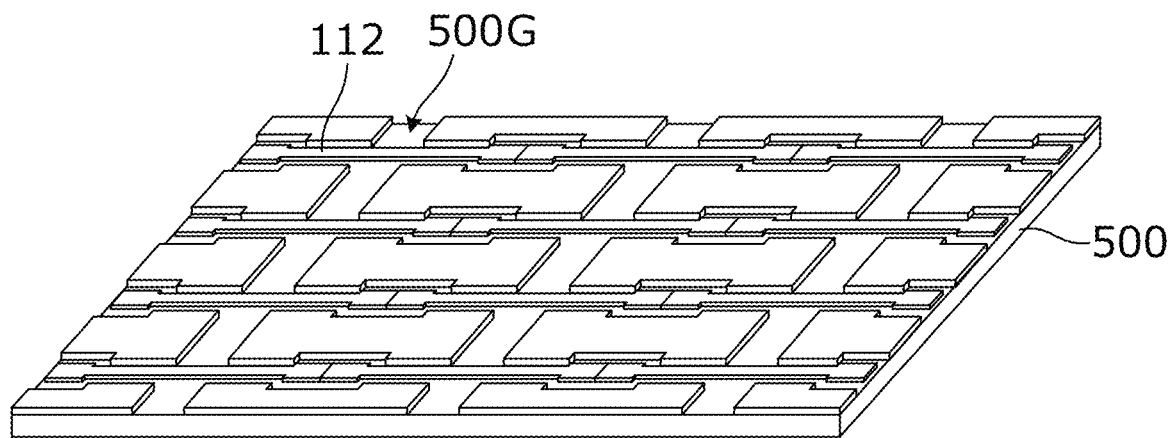
FIG. 27 is a view of a configuration showing an electrical element tray according to a twelfth preferred embodiment of the present invention, and is a perspective view showing a storage and conveyance of a plurality of electrical elements.

FIG. 27 is a perspective view of a configuration showing a storage and conveyance of a plurality of electrical elements 112. A tray 500 is provided with a placing portion in which the plurality of electrical elements 112 is placed. The configuration of each of the electrical elements 112 is basically the same or substantially the same as the configuration of the electrical element 101 described in the first preferred embodiment. The differences are described below.

Figure 28:
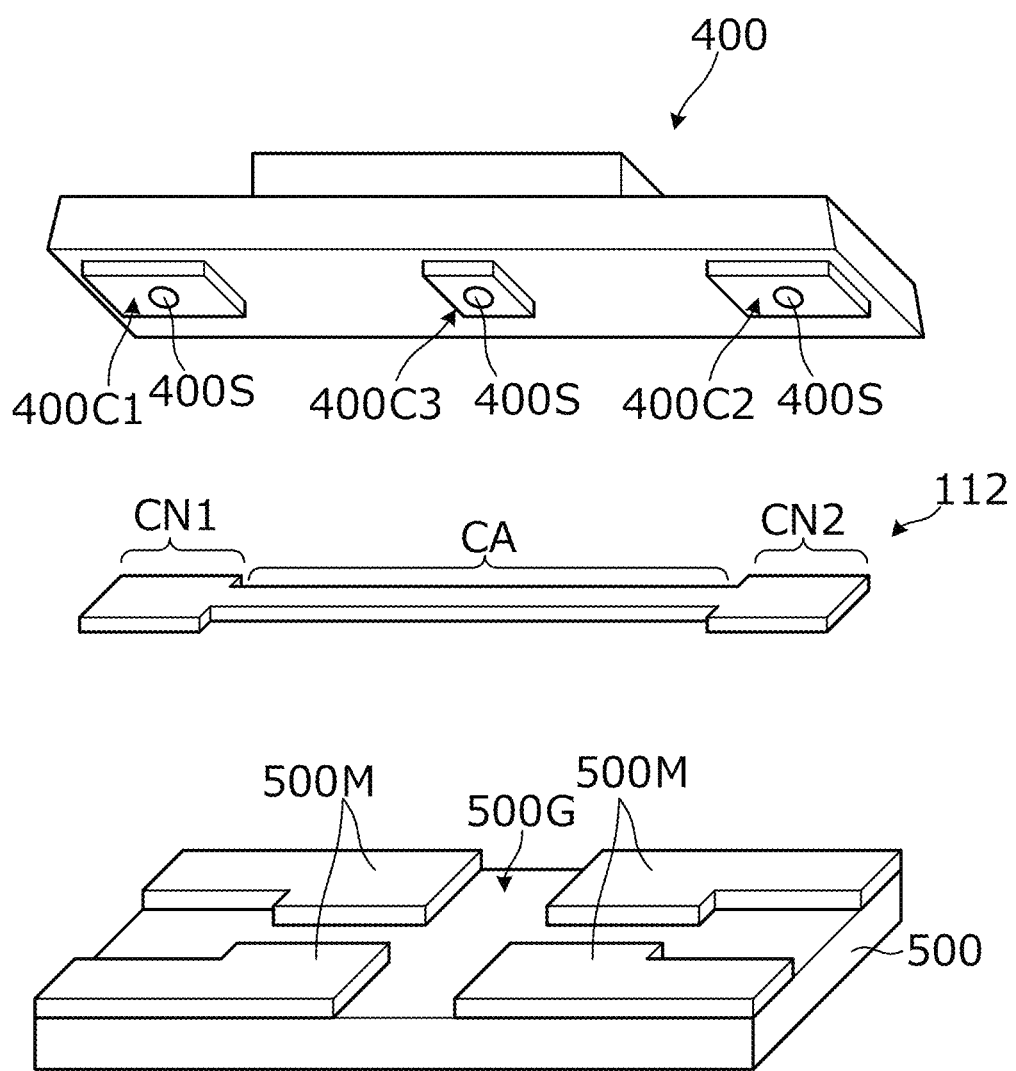
FIG. 28 is a perspective view showing a configuration of a portion of a tray, an electrical element, and a tip tool according to the twelfth preferred embodiment of the present invention.

FIG. 28 is a perspective view showing a configuration of a portion of the tray 500, an electrical element 112, and a tip tool 400 of a conveying device. The tray 500 includes a concave portion 500G and a convex portion 500M. The electrical element 112, while stored in the concave portion 500G, is prevented from moving in the planar direction by the convex portion 500M. In other words, the concave portion 500G and the convex portion 500M prevent the positional shift of the electrical element 112. In particular, a plurality of the convex portions 500M are included so as to nip the transmission line portion CA of the electrical element 112 in the width direction. Therefore, the transmission line portion CA is able to be accurately adsorbed.

The tip tool 400 is attached to a vacuum adsorption chuck of the conveying device and provides an adsorption head. The tip tool 400 is provided with adsorption portions 400C1, 400C2, and 400C3 that respectively adsorb the first connection portion CN1, the second connection portion CN2, and the transmission line portion CA on the undersurface of the tip tool 400. Each of the adsorption portions 400C1, 400C2, and 400C3 includes a suction port 400S.

Of the concave portions 500G included in the tray 500, a portion extending in a groove shape in the vertical direction (that is, direction perpendicular or substantially perpendicular to the extending direction of the transmission line portion CA) is provided in a position in which the adsorption portion 400C3 does not interfere. Therefore, the adsorption portion 400C3 is able to appropriately suck the transmission line portion CA of the electrical element 112 without sucking the tray 500.

When a manufactured electrical element 112 is carried, a large number of electrical elements 112 are placed in the tray 500 and handled in the unit of the tray. In addition, when the electrical element 112 is mounted on a substrate, by using an automatic mounting machine, the electrical element 112 is picked up from the tray 500 and mounted on a substrate.

Figure 29:
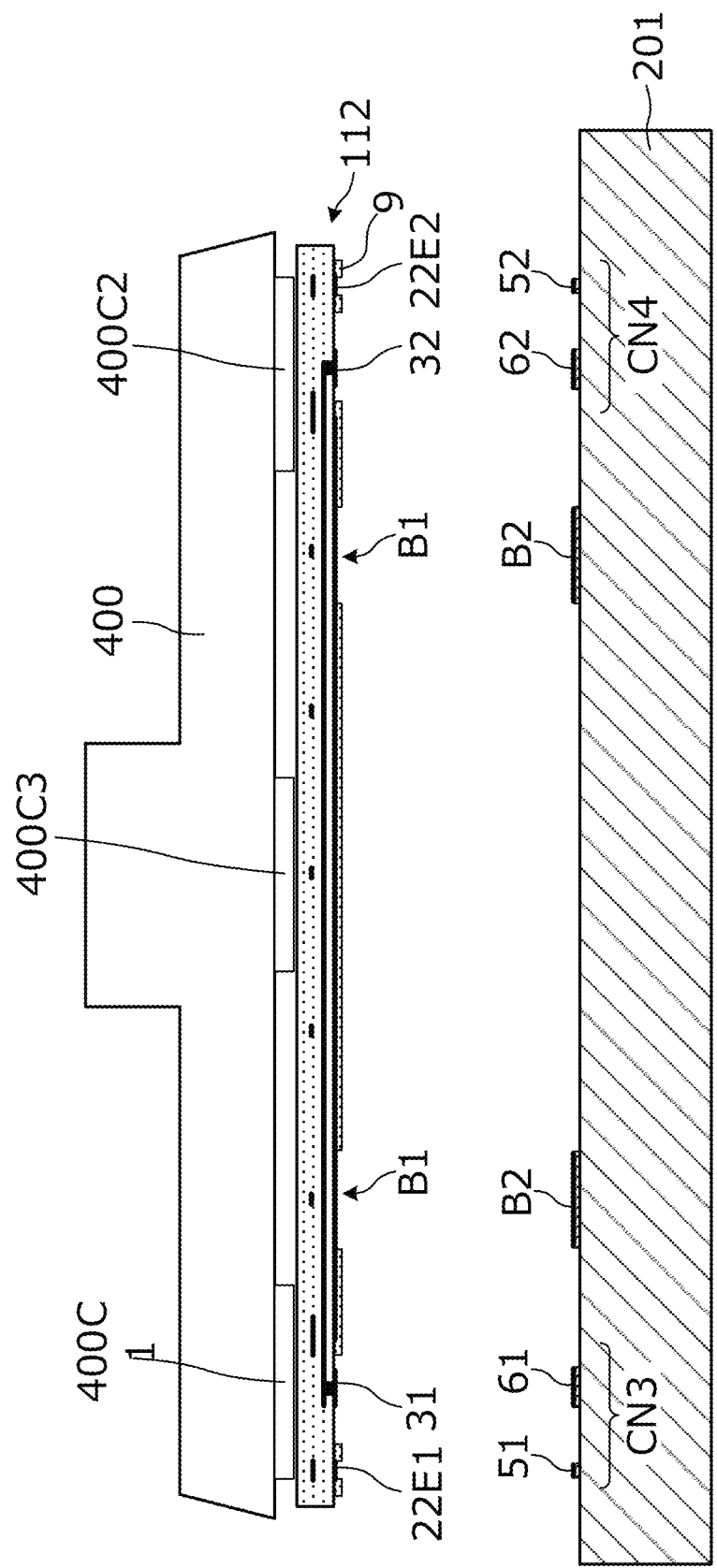
FIG. 29 is a sectional view showing the electrical element mounted on the substrate according to the twelfth preferred embodiment of the present invention.
Figure 30:
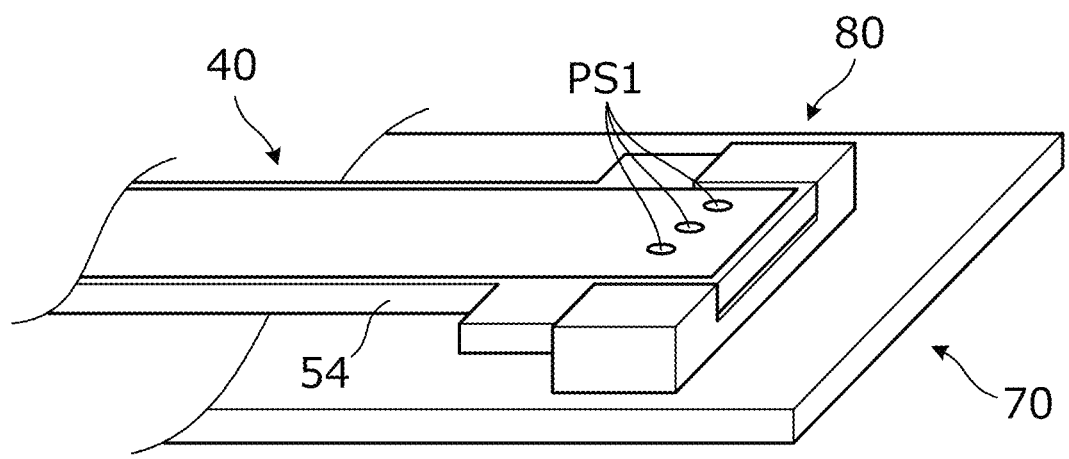
FIG. 30 is a perspective view showing a mounting structure to mount on a substrate 70 a flat cable 40 disclosed in International Publication No. 2014/002757.

FIG. 29 is a sectional view showing the electrical element 112 mounted on the substrate 201. A process of mounting the electrical element 112 on the substrate 201 is basically the same or substantially the same as the process shown in FIG. 5 in the first preferred embodiment. The electrical element 112 according to the twelfth preferred embodiment does not include the electrical-element-side bonding patterns B1 adjacent to or in a vicinity of the adsorption portion 400C3 for the transmission line portion. That is, the adsorption portion 400C3 does not overlap the electrical-element-side bonding pattern B1 at least in a plan view. Accordingly, as compared with when the electrical-element-side bonding pattern B1 is provided adjacent to or in a vicinity of the adsorption portion 400C3 for the transmission line portion, the adsorption portion 400C3 is less likely to adsorb the solder printed on the substrate-side bonding pattern B2 when mounting the electrical element 112 on the substrate 201. Therefore, clogging of the adsorption portion 400C3 due to suction of solder is significantly reduced or prevented.

Since the adsorption portions 400C1 and 400C2 of the first connection portion CN1 and the second connection portion CN2 adsorb the wide first connection portion CN1 and second connection portion CN2, even if the substrate-side bonding pattern B2 is adjacent to or in a vicinity of the first connection portion CN1 and the second connection portion CN2, the adsorption portions 400C1 and 400C2 do not adsorb the solder printed on the substrate-side bonding pattern B2 at the time of mounting the electrical element.

Other Preferred Embodiments

While, in the preferred embodiments described above, an example in which one stripline is provided in a transmission line portion is described above, various preferred embodiments of the present invention may similarly be applied to a case in which a multi-core stripline is provided, the multi-core stripline sharing a ground conductor pattern and including a plurality of signal conductor patterns.

Further, while the preferred embodiments described above have described examples of a stripline type transmission line, preferred embodiments of the present invention may also be applied to other types of transmission lines, for example, a microstrip line, a coplanar line, or a slot line.

Finally, the foregoing preferred embodiments are illustrative in all points and should not be construed to limit the present invention. It is understood that variations and modifications will be apparent to those skilled in the art without departing from the scope and spirit of the present invention. For example, configurations shown in different preferred embodiments are able to be partially replaced and combined with each other. The scope of the present invention is defined not by the foregoing preferred embodiment but by the following claims. Further, the scope of the present invention is intended to include all modifications within the scopes of the claims and within the meanings and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic apparatus comprising:
   a substrate including a main surface;
   an electronic component mounted on the main surface of the substrate; and
   an electrical element surface-mounted on the main surface of the substrate; wherein
   the electrical element includes:
      a base material including a plurality of laminated electrical insulating materials;
      a transmission line portion included at the base material; and
      a first connection portion and a second connection portion included at the base material, and each of the first connection portion and the second connection portion being continuous with a corresponding one of a plurality of portions of the transmission line portion;
   the base material includes a recessed portion in which a cavity is provided in at least one of the plurality of laminated electrical insulating materials such that a number of the plurality of laminated electrical insulating materials at other portions of the base material outside of the recessed portion is greater than a number of the plurality of laminated electrical insulating materials at the recessed portion;
   each of the first connection portion and the second connection portion is provided at a corresponding one of the other portions;
   each of the first connection portion and the second connection portion is connected to a circuit included at the substrate by an electrically conductive bonding material;
   the electrical element is surface-mounted on the substrate such that the recessed portion faces the electronic component; and
   in a direction perpendicular to the main surface of the substrate, a dimension of each of the other portions is greater than a dimension of the electronic component facing the recessed portion.

2. The electronic apparatus according to claim 1, wherein
the base material is deformable and includes a first principal surface and a second principal surface that are flat or substantially flat surfaces;
the electrical element further includes an electrical-element-side bonding pattern located in a position different from positions of the first connection portion and the second connection portion and connected to a conductor included at the substrate;
the first connection portion, the second connection portion and the electrical-element-side bonding pattern are exposed on the first principal surface of the base material;
the substrate includes:
a third connection portion;
a fourth connection portion; and
a substrate-side bonding pattern;
the first connection portion and the third connection portion are connected to each other through the electrically conductive bonding material;
the second connection portion and the fourth connection portion are connected to each other through the electrically conductive bonding material; and
the electrical-element-side bonding pattern and the substrate-side bonding pattern are connected to each other through the electrically conductive bonding material.

3. The electronic apparatus according to claim 2, wherein
the base material further includes a bending portion bent in a surface direction of the base material in a plan view; and
the electrical-element-side bonding pattern includes a portion that is bent in the surface direction of the base material along the bending portion in the plan view.

4. The electronic apparatus according to claim 2, wherein the electrical-element-side bonding pattern is at least provided in a vicinity to the first connection portion of the transmission line portion or in a vicinity to the second connection portion of the transmission line portion.

5. The electronic apparatus according to claim 4, wherein the electrical-element-side bonding pattern is at least provided in a range from a boundary between the first connection portion and the transmission line portion to one-third of a length in an extending direction of the transmission line portion or in a range from a boundary between the second connection portion and the transmission line portion to one-third of the length in the extending direction of the transmission line portion.

6. The electronic apparatus according to claim 2, wherein the transmission line portion includes a plurality of signal conductor patterns.

7. The electronic apparatus according to claim 6, wherein the transmission line portion includes a strip line structure or a microstrip line structure provided by a ground conductor pattern and the plurality of signal conductor patterns.

8. The electronic apparatus according to claim 7, wherein the electrical-element-side bonding pattern is a conductor pattern electrically connected to the ground conductor pattern or a portion of the ground conductor pattern.

9. The electronic apparatus according to claim 2, wherein the electrical element further includes a double-sided adhesive tape, the double-sided adhesive tape is provided in a portion in which the electrical-element-side bonding pattern is absent.

10. The electronic apparatus according to claim 1, wherein the base material of the transmission line portion has a smaller width than the base material of the first connection portion and the second connection portion.

* * * * *